(12) United States Patent
Kim et al.

(10) Patent No.: US 8,094,487 B2
(45) Date of Patent: Jan. 10, 2012

(54) METHOD FOR READ-OUT OF INFORMATION IN MAGNETIC RECORDING ELEMENT AND METHOD FOR READ-OUT OF INFORMATION IN MAGNETIC RANDOM ACCESS MEMORY

(75) Inventors: Sang-Koog Kim, Seoul (KR); Ki-Suk Lee, Seoul (KR); Young-Sang Yu, Seoul (KR)

(73) Assignee: SNU R&DB Foundation, Seoul (KR)

( * ) Notice: Subject to any disclaimer, the term of this patent is extended or adjusted under 35 U.S.C. 154(b) by 89 days.

(21) Appl. No.: 12/738,657

(22) PCT Filed: Oct. 17, 2008

(86) PCT No.: PCT/KR2008/006151
§ 371 (c)(1),
(2), (4) Date: Apr. 19, 2010

(87) PCT Pub. No.: WO2009/051442
PCT Pub. Date: Apr. 23, 2009

(65) Prior Publication Data
US 2010/0271728 A1    Oct. 28, 2010

(30) Foreign Application Priority Data

Oct. 19, 2007 (KR) .................. 10-2007-0105593
Oct. 19, 2007 (KR) .................. 10-2007-0105604

(51) Int. Cl.
*G11C 11/14* (2006.01)
*G11C 11/15* (2006.01)
(52) U.S. Cl. .................. 365/158; 365/171; 365/173
(58) Field of Classification Search .................. 365/158
See application file for complete search history.

(56) References Cited

U.S. PATENT DOCUMENTS 6,504,665 B1    1/2003    Mukasa et al.
(Continued)

FOREIGN PATENT DOCUMENTS

JP    07-044925 A    2/1995
(Continued)

OTHER PUBLICATIONS

International Search Report: PCT/KR2008/006151.

*Primary Examiner* — Son Mai
(74) *Attorney, Agent, or Firm* — Ladas & Parry LLP

(57) ABSTRACT

Provided are a method for read-out of information in a magnetic recording element and a method for read-out of information in a magnetic random access memory. In the method, a magnetic recording element including a magnetic free layer where a magnetic vortex is formed is prepared, and "0" or "1" is assigned according to a core orientation of a magnetic vortex formed in the magnetic free layer. The magnetic vortex core formed in the magnetic free layer rotates on the magnetic free layer by applying a current or magnetic field, of which a direction varies with time, to the magnetic free layer with the magnetic vortex formed. "0" or "1" assigned according to the core orientation of the magnetic vortex formed in the magnetic free layer is read out by measuring a characteristic caused by a difference in a rotation radius of the magnetic vortex core. Herein, the rotation radius of the magnetic vortex core, which is formed in the magnetic free layer and rotates by the applied current or magnetic field, varies with the core orientation of the magnetic vortex formed in the magnetic free layer.

18 Claims, 16 Drawing Sheets

U.S. PATENT DOCUMENTS

| | | | |
|---|---|---|---|
| 7,072,208 B2 * | 7/2006 | Min et al. | 365/171 |
| 7,898,849 B2 * | 3/2011 | Clinton et al. | 365/173 |
| 7,936,595 B2 * | 5/2011 | Han et al. | 365/171 |
| 7,952,915 B2 * | 5/2011 | Ono et al. | 365/158 |
| 2006/0215446 A1 * | 9/2006 | Hong et al. | 365/171 |
| 2009/0180311 A1 | 7/2009 | Ono et al. | |
| 2009/0273972 A1 * | 11/2009 | Han et al. | 365/173 |
| 2010/0290281 A1 * | 11/2010 | Kim et al. | 365/171 |

FOREIGN PATENT DOCUMENTS

| | | |
|---|---|---|
| JP | 2007-226945 A | 9/2007 |
| KR | 20020089141 A | 11/2002 |
| KR | 20040092706 A | 11/2004 |
| KR | 20070036673 A | 4/2007 |
| KR | 20070097595 A | 10/2007 |
| WO | 2007/105358 A1 | 9/2007 |

* cited by examiner

[Fig. 1]
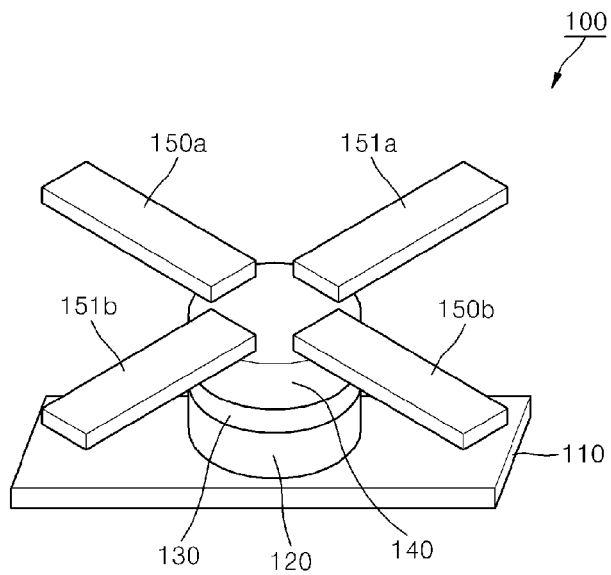
[Fig. 2]
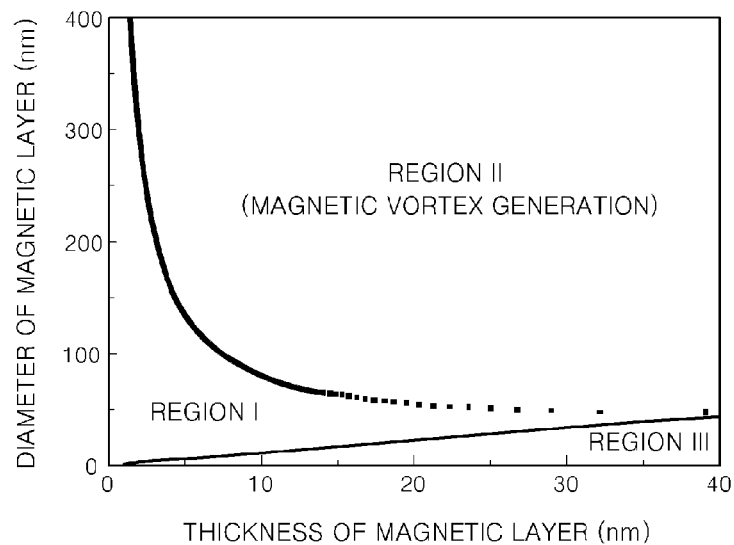
[Fig. 3]
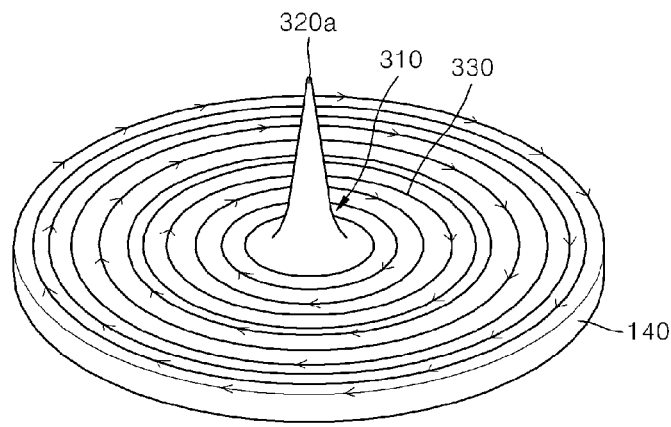

[Fig. 4]
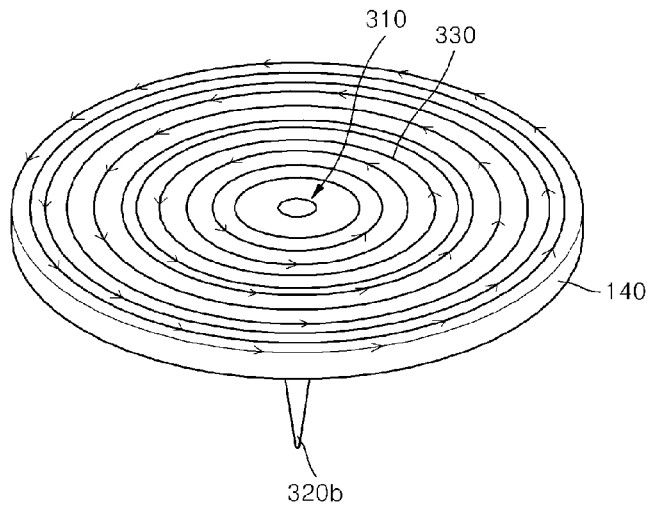
[Fig. 5]
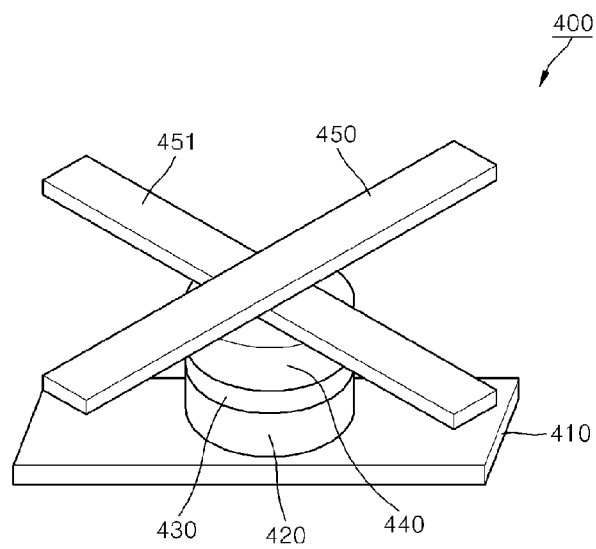
[Fig. 6]
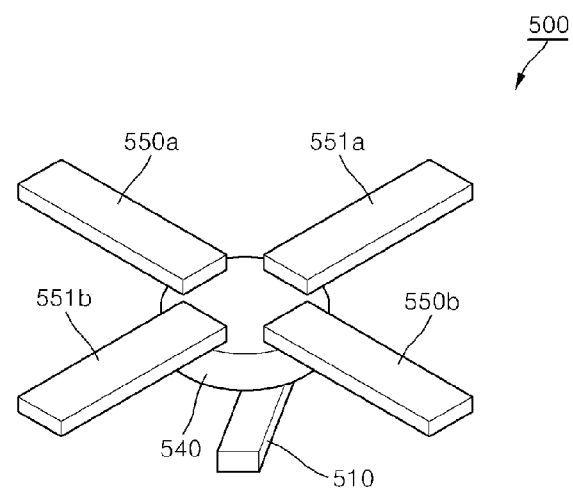

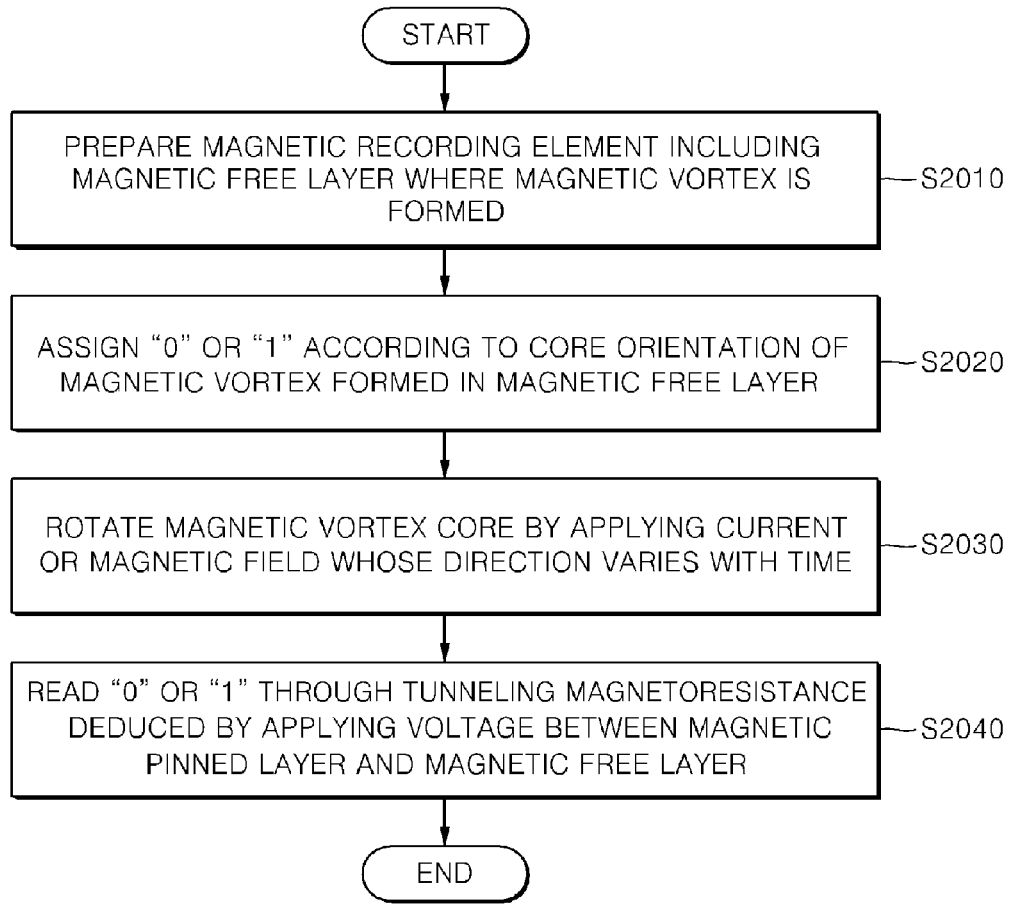
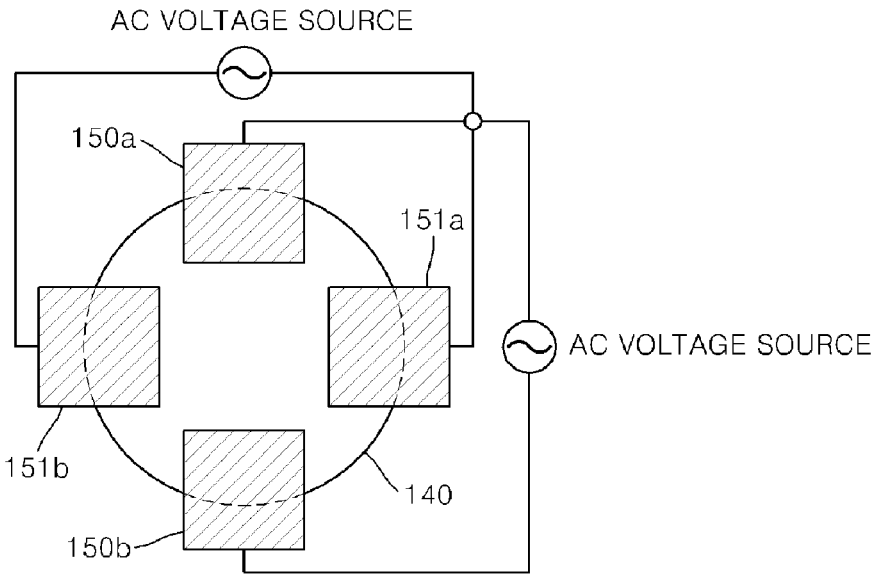

[Fig. 9]
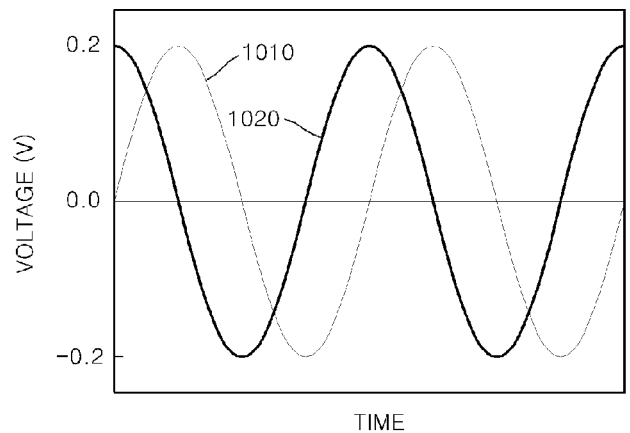
[Fig. 10]
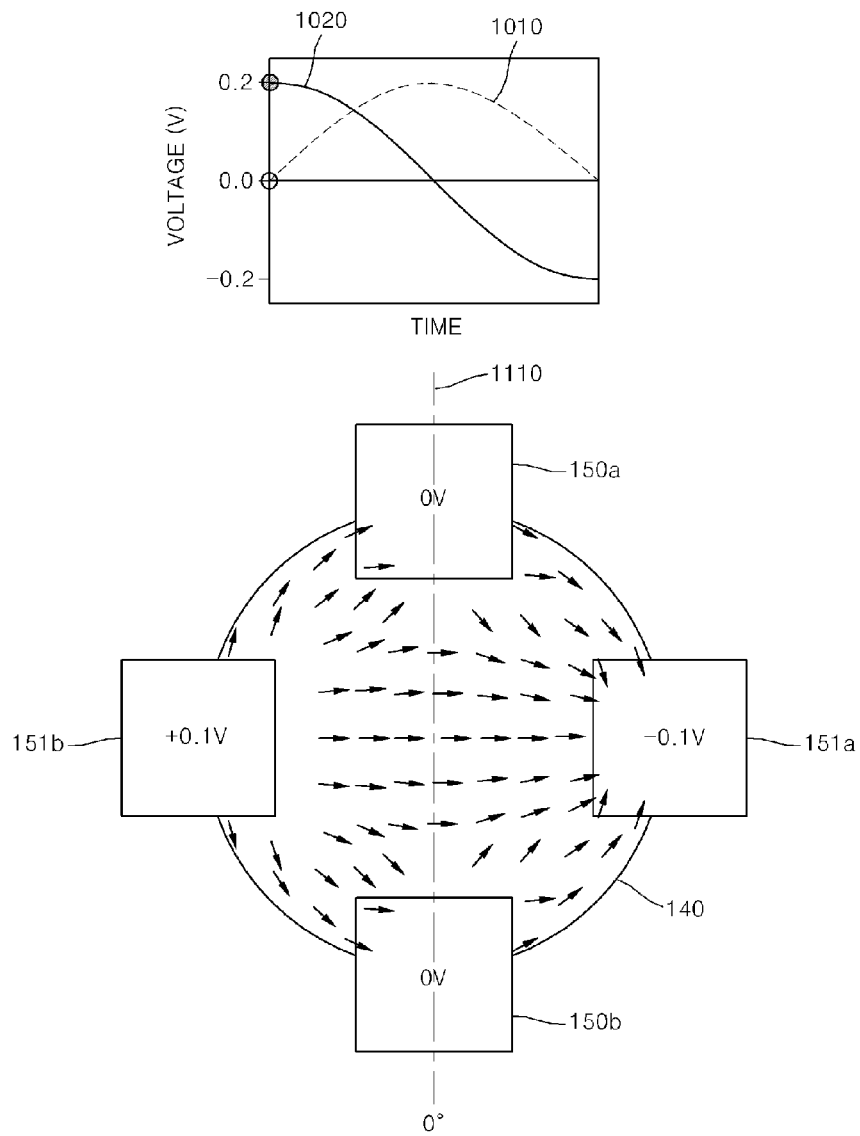

[Fig. 11]
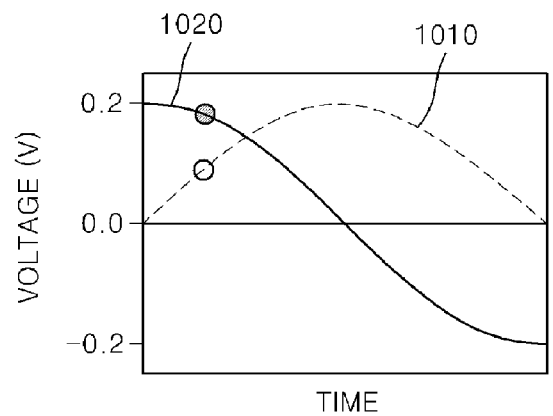
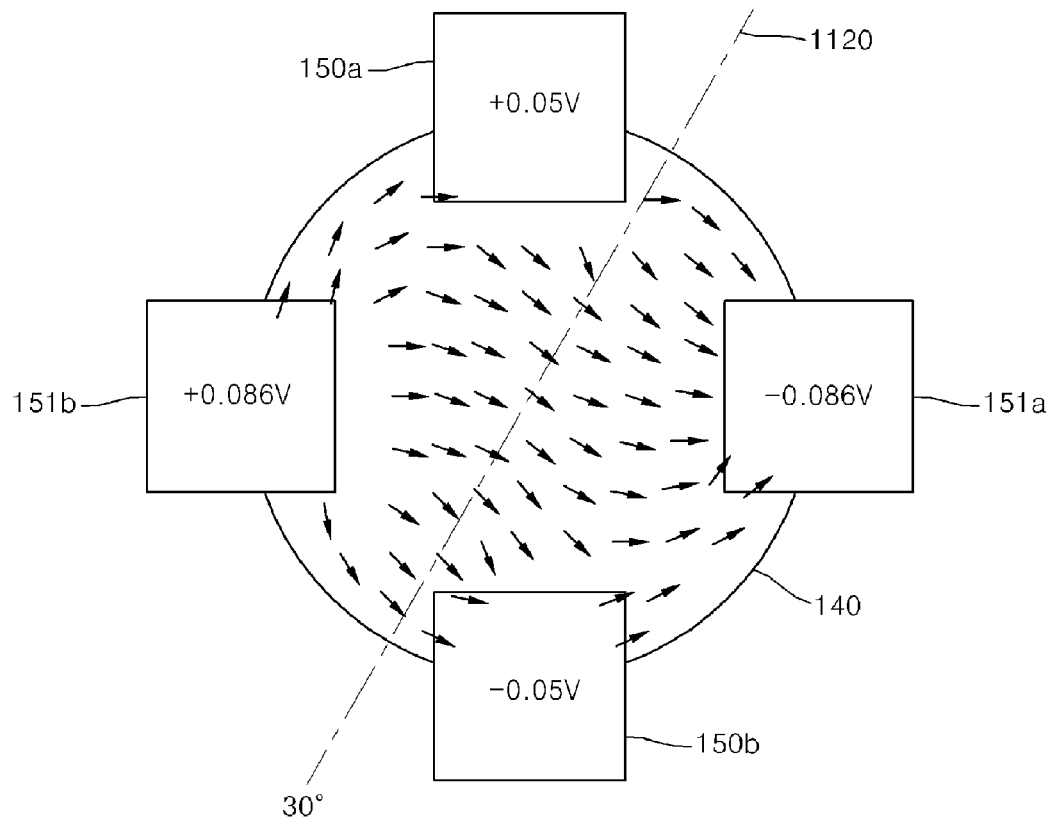

[Fig. 12]
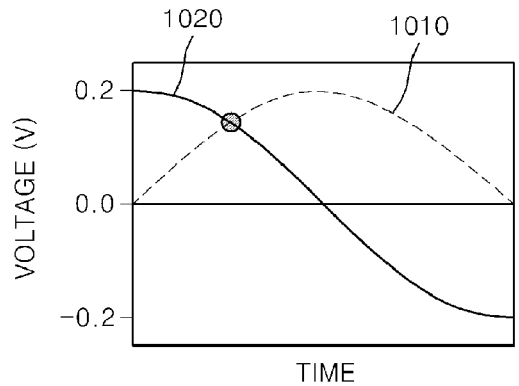
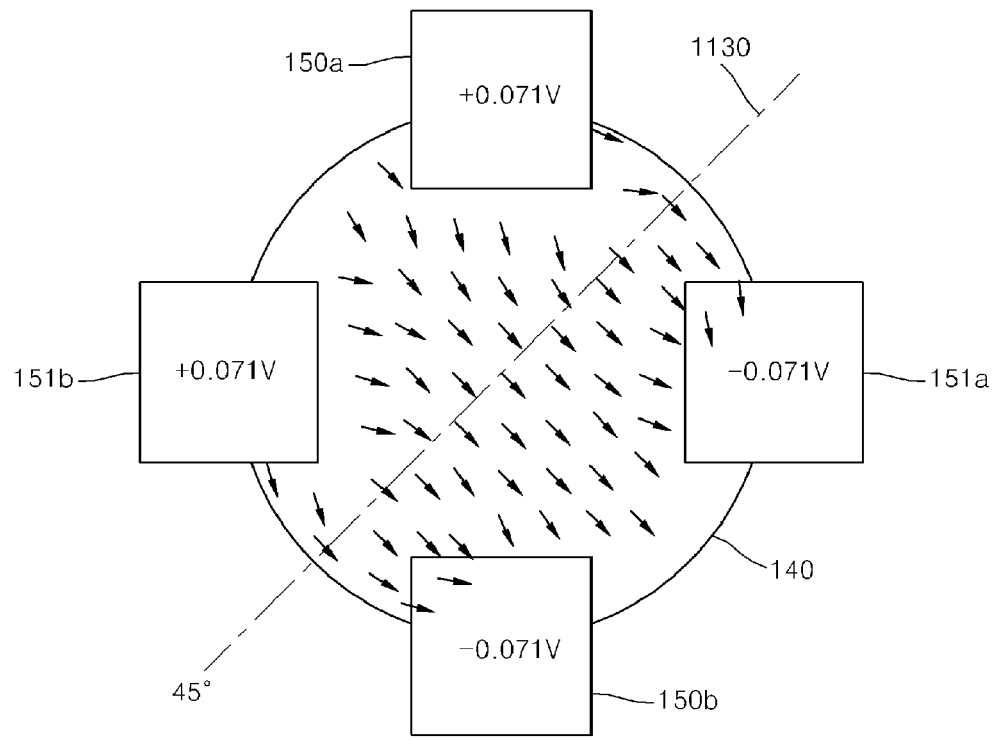
[Fig. 13]
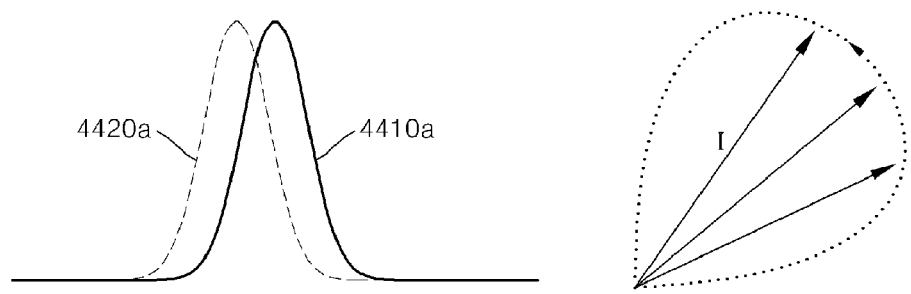

[Fig. 14]
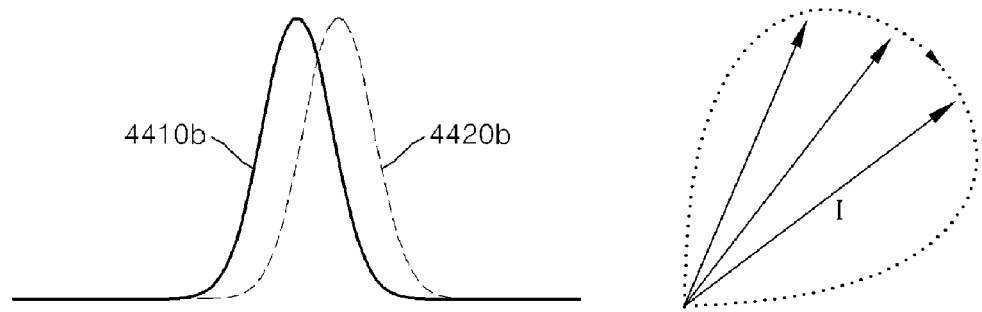
[Fig. 15]
[Fig. 16]
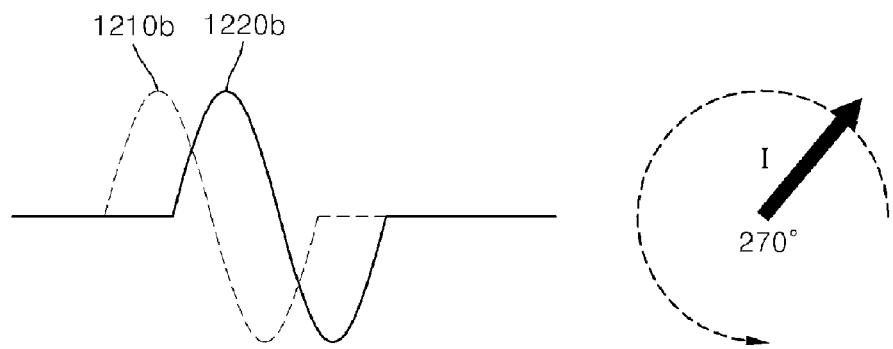
[Fig. 17]
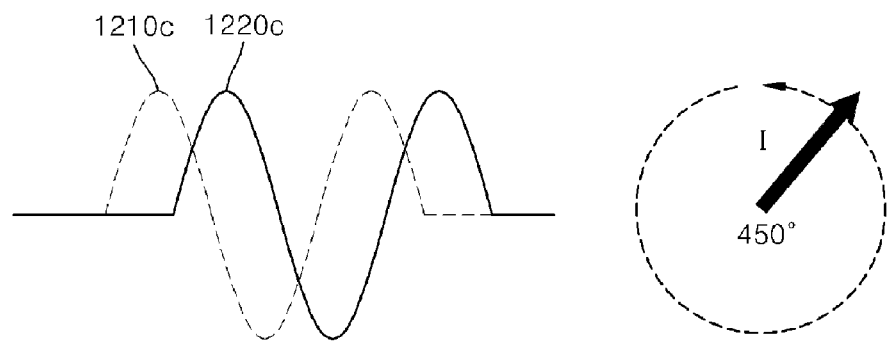

[Fig. 18]
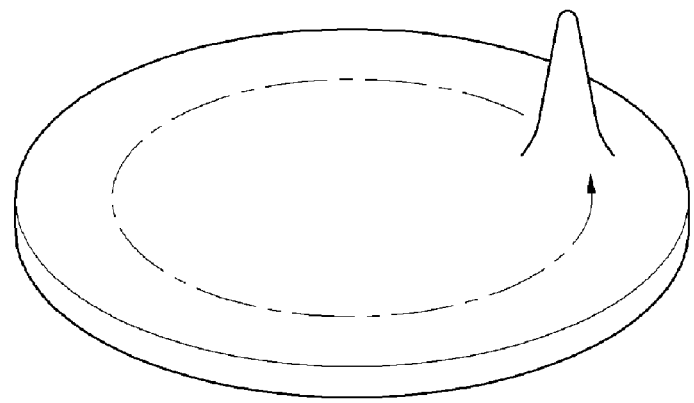
[Fig. 19]
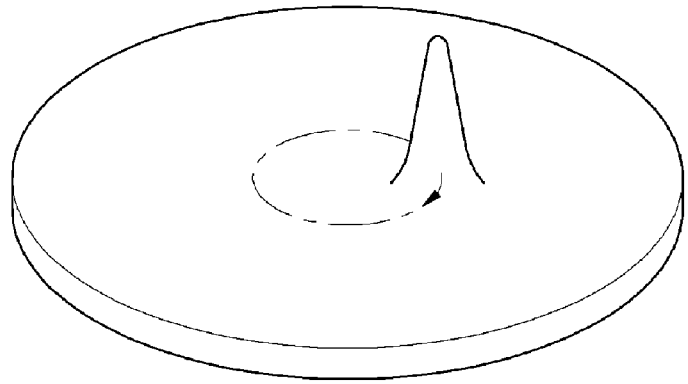
[Fig. 20]
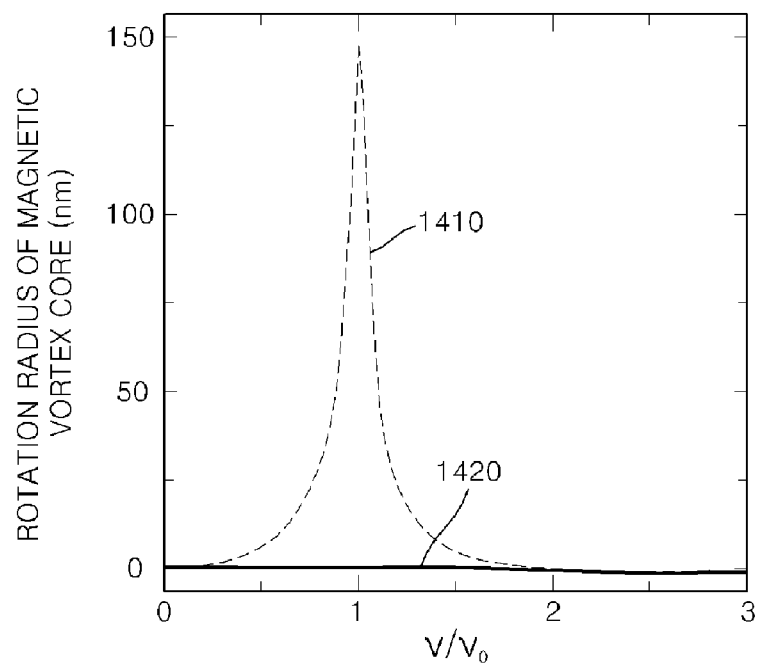

[Fig. 21]
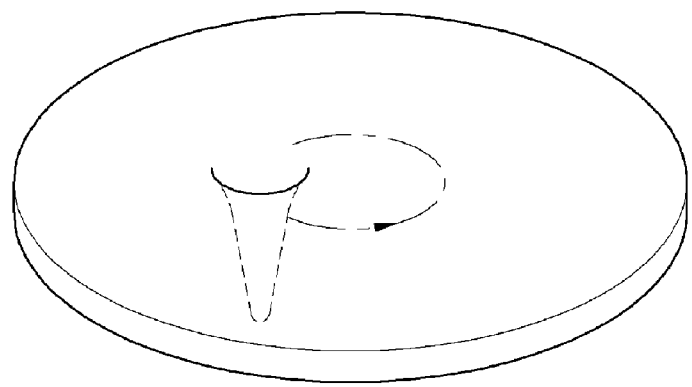
[Fig. 22]
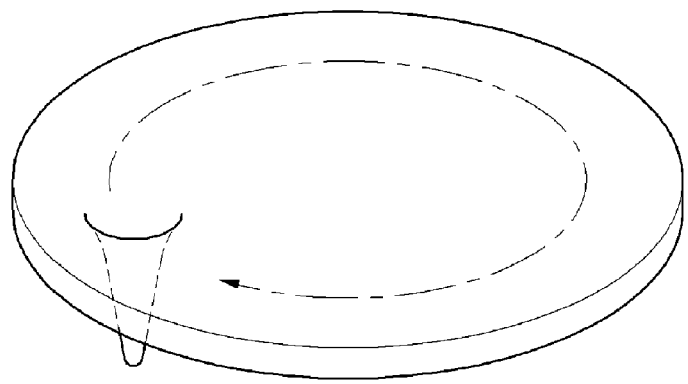
[Fig. 23]
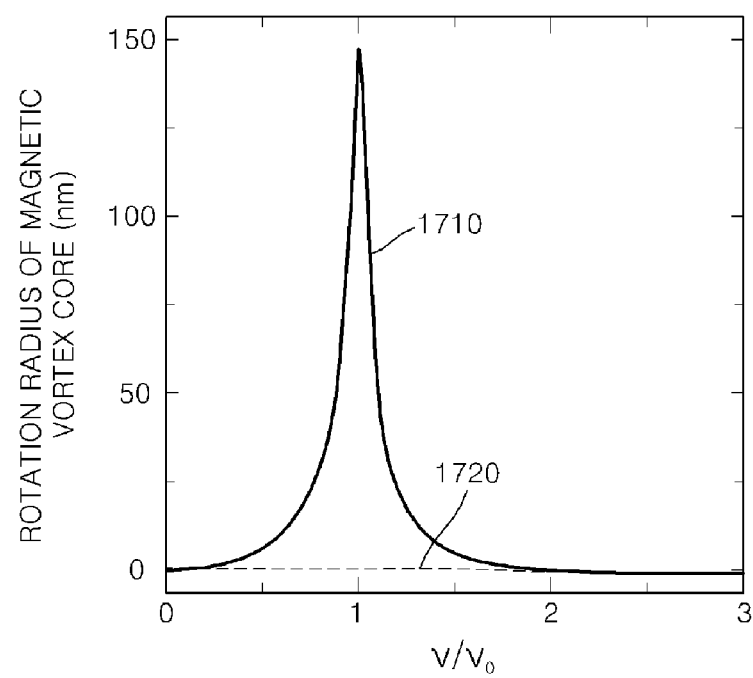

[Fig. 24]
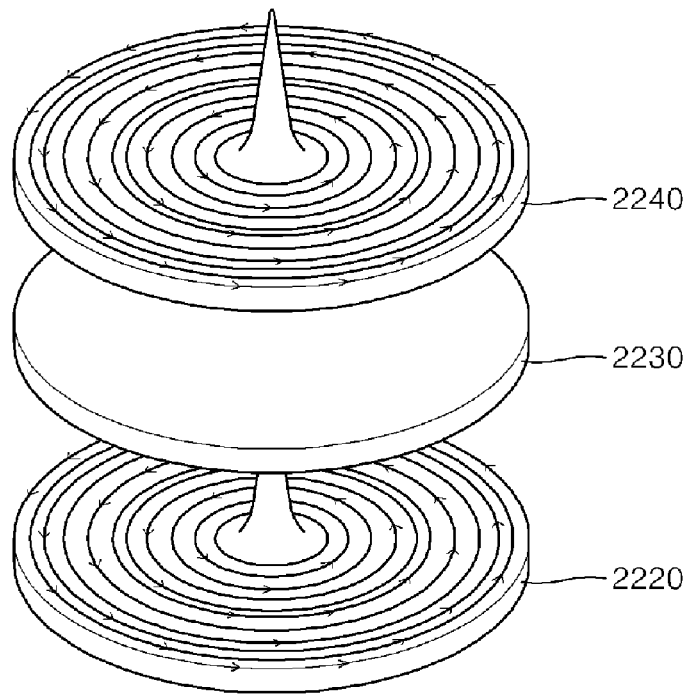
[Fig. 25]
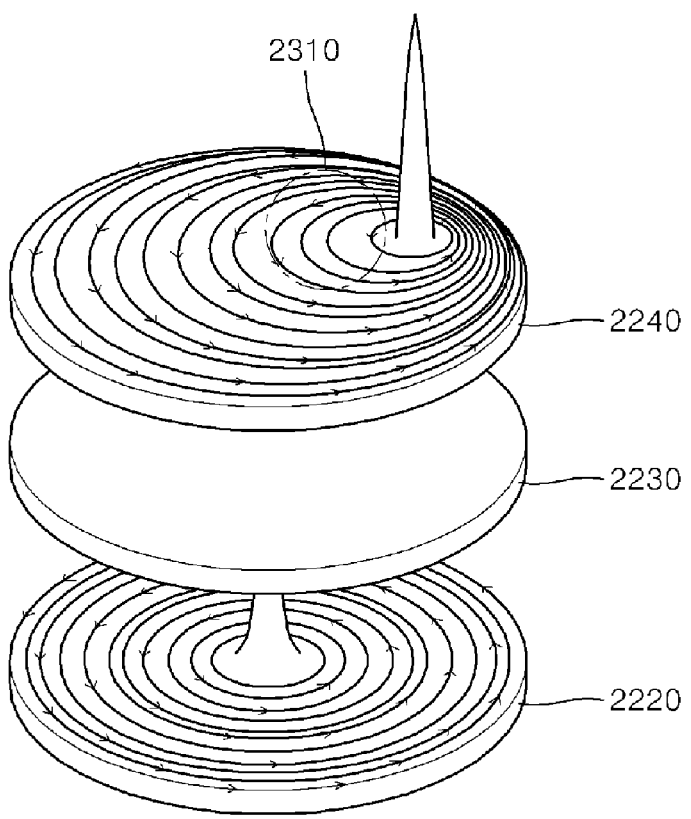

[Fig. 26]
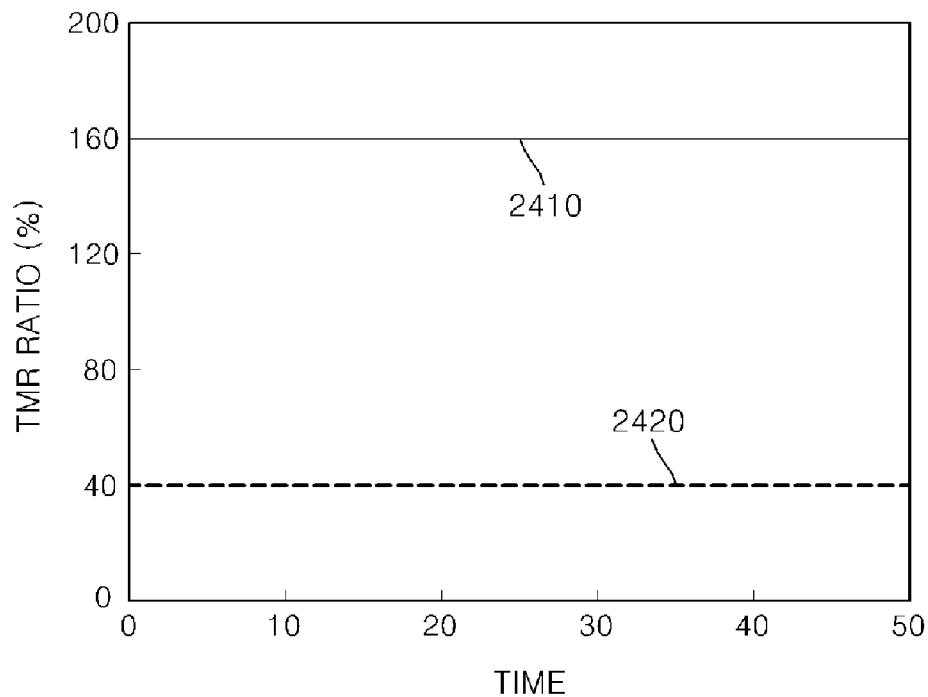
[Fig. 27]
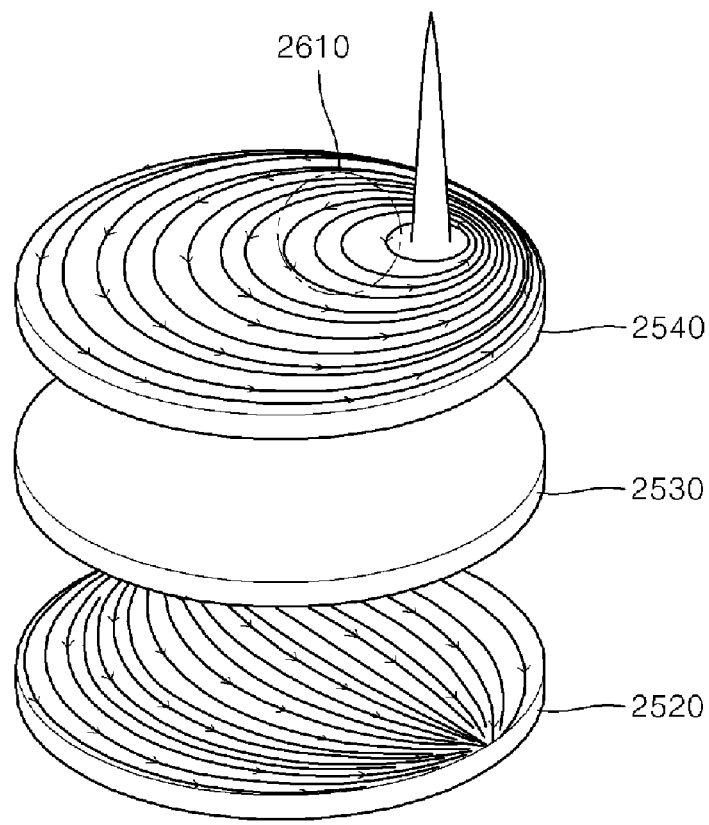

[Fig. 28]
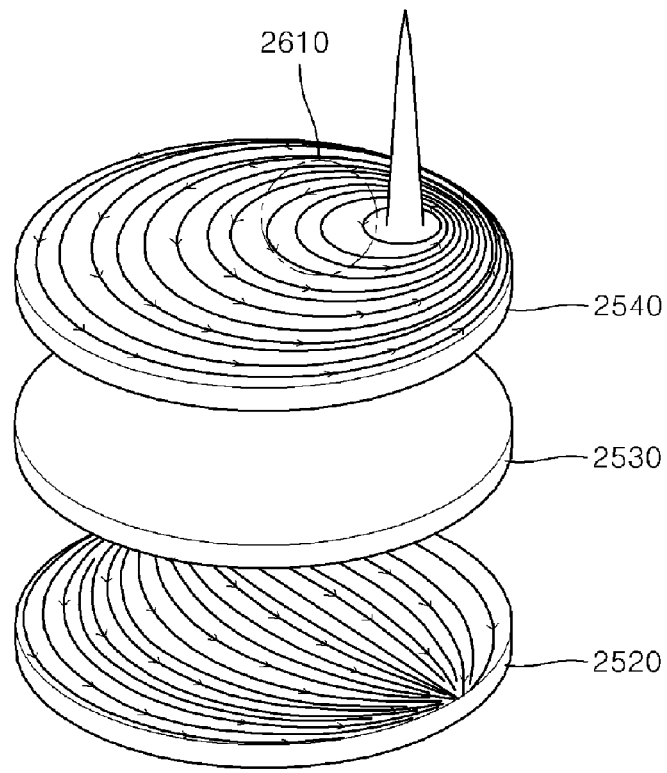
[Fig. 29]
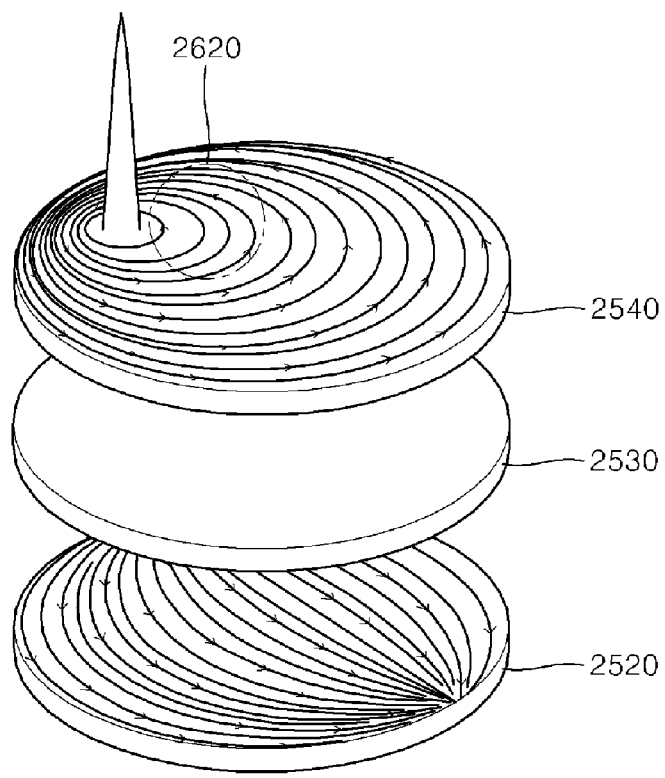

[Fig. 30]
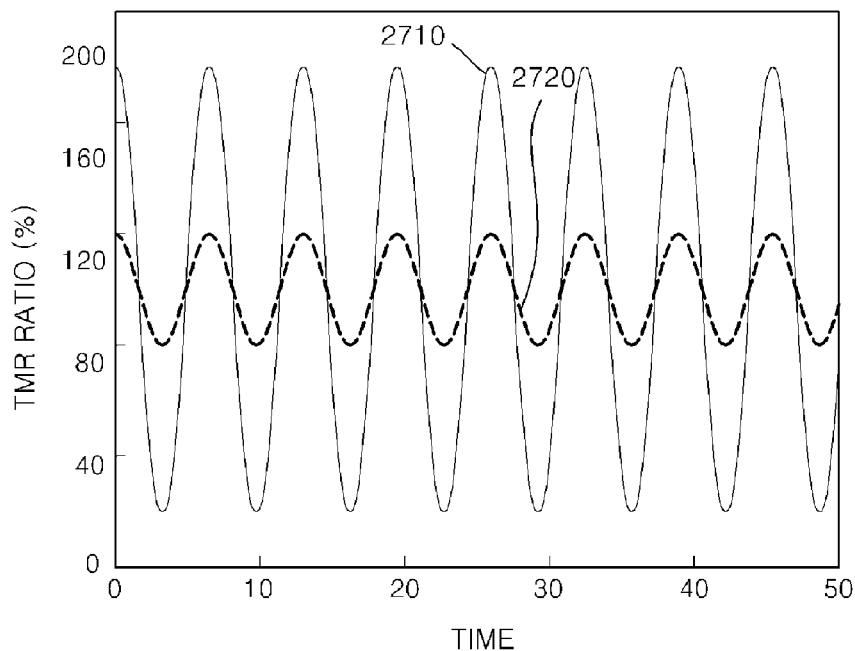
[Fig. 31]
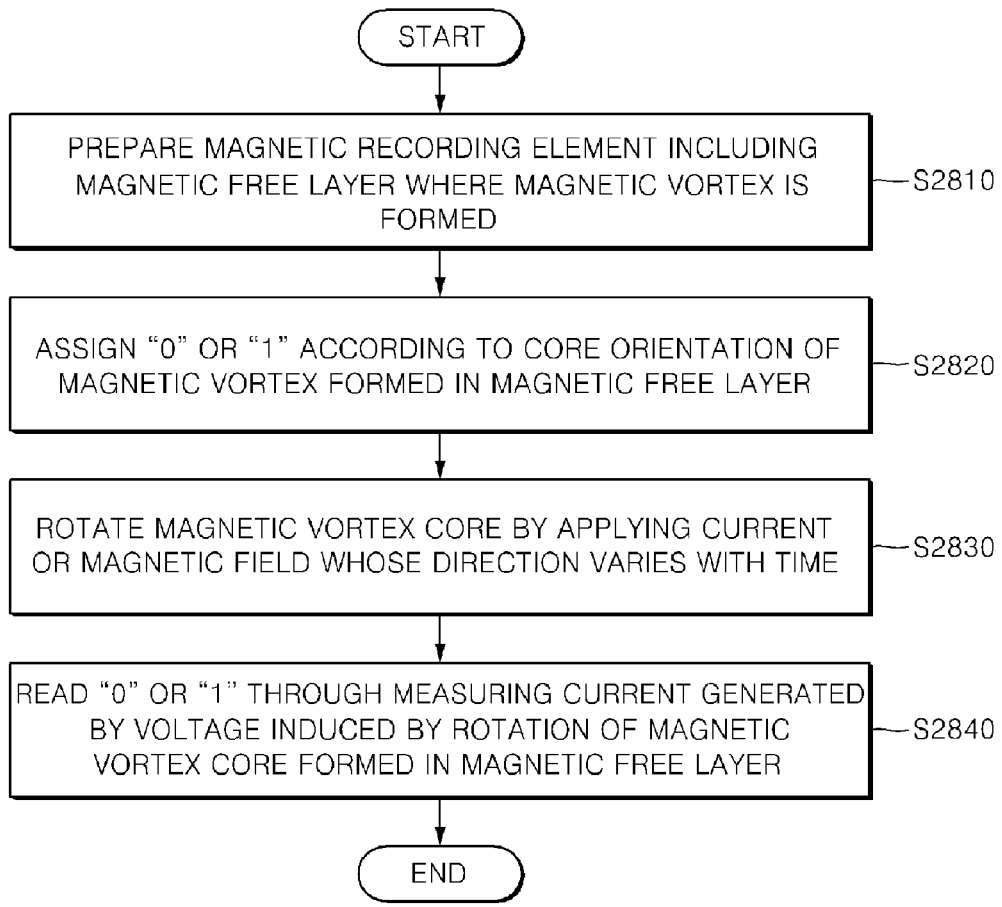

[Fig. 32]
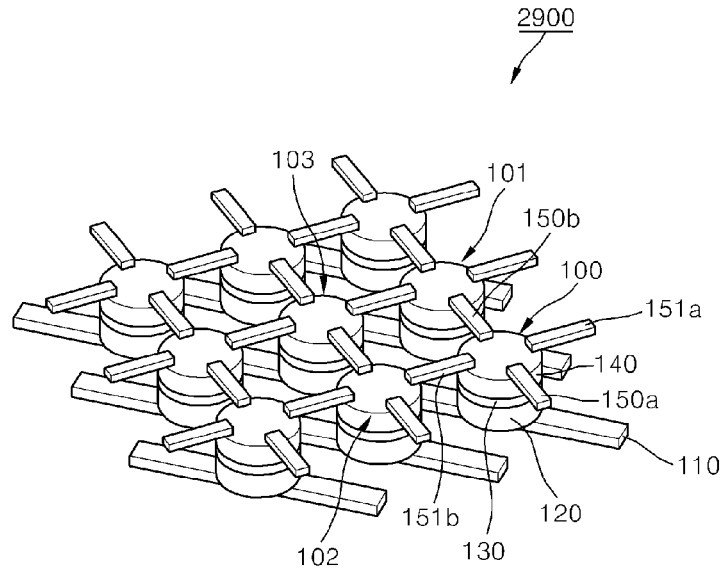
[Fig. 33]
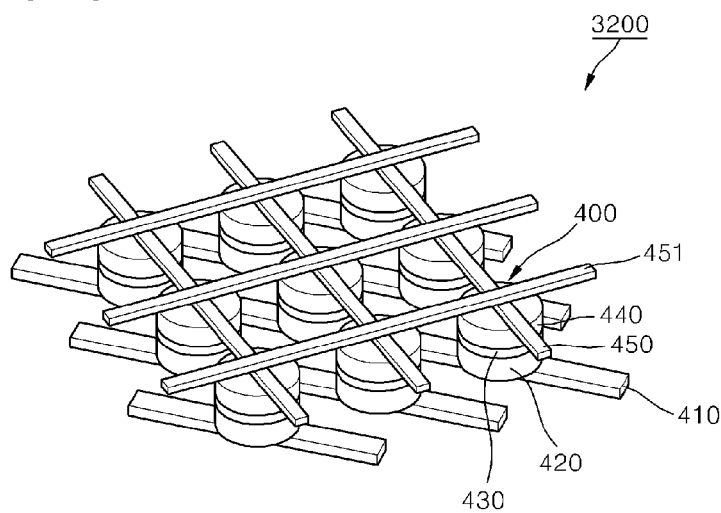
[Fig. 34]
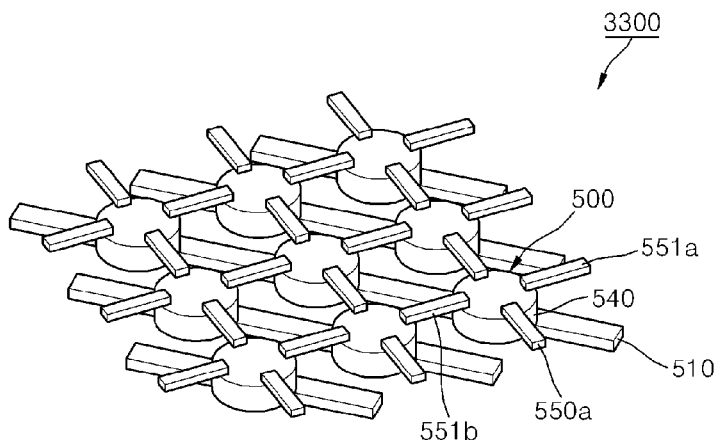

[Fig. 35]
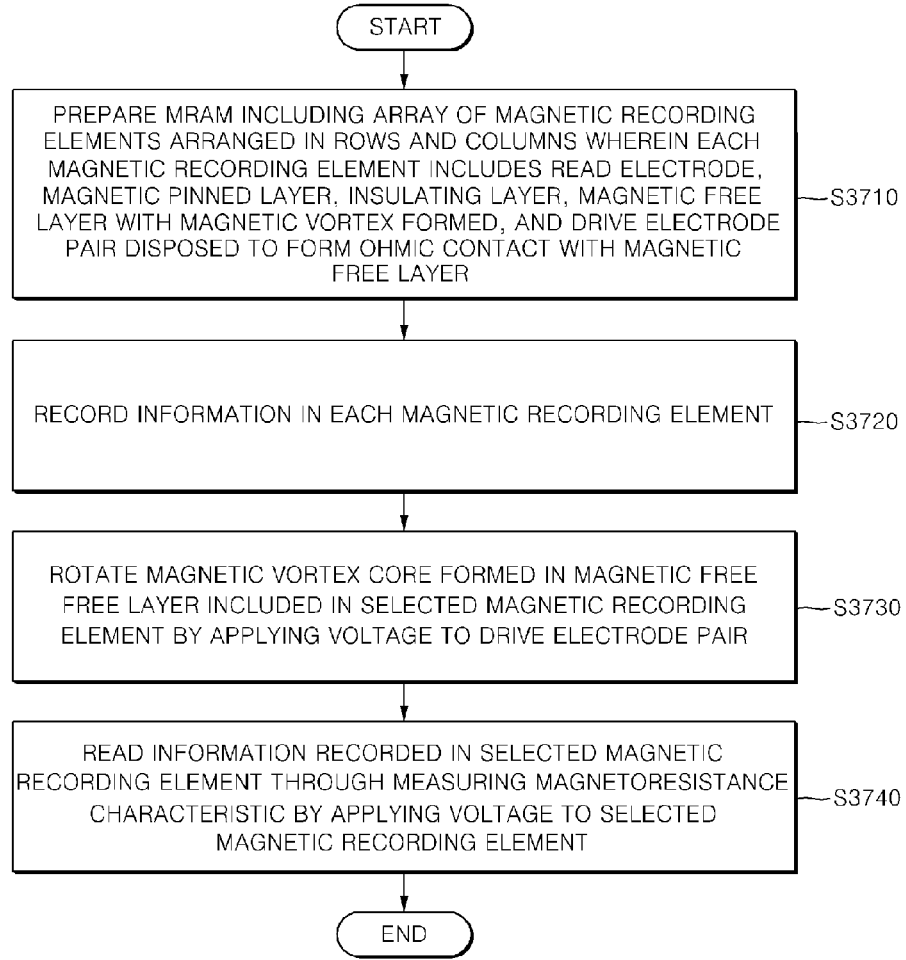
[Fig. 36]
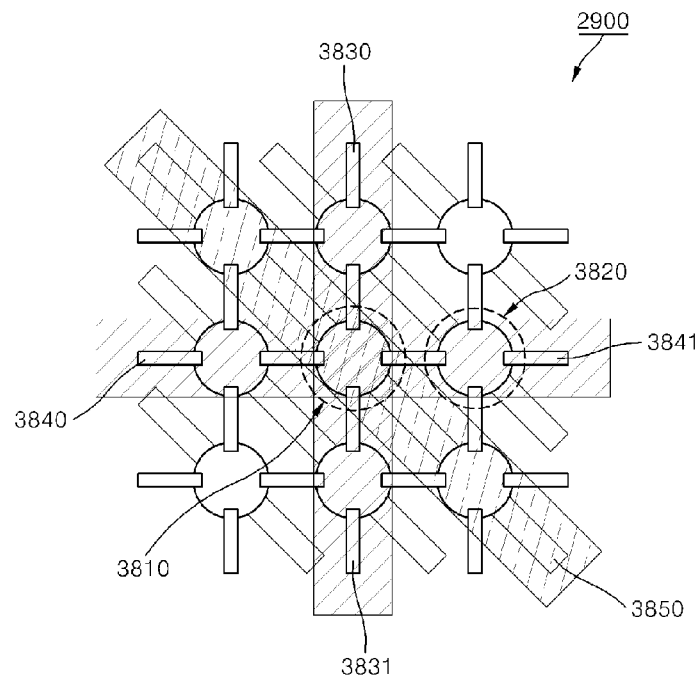

[Fig. 37]
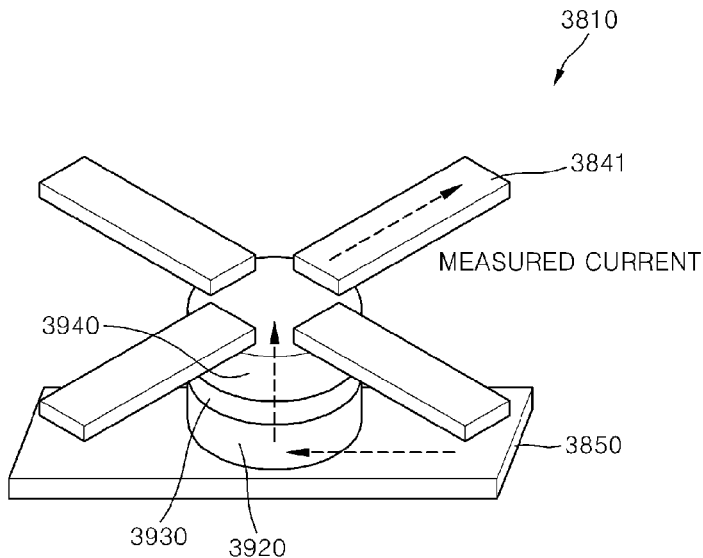
[Fig. 38]
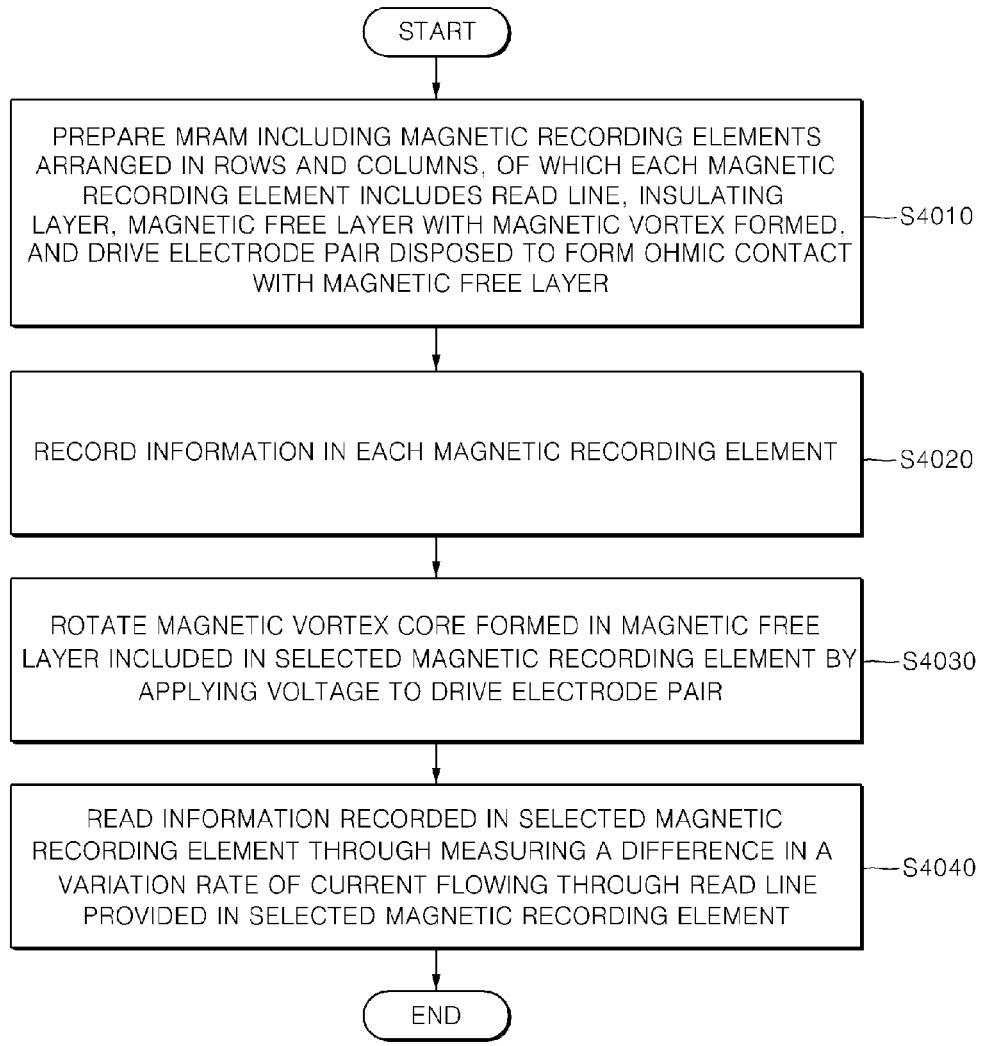

METHOD FOR READ-OUT OF INFORMATION IN MAGNETIC RECORDING ELEMENT AND METHOD FOR READ-OUT OF INFORMATION IN MAGNETIC RANDOM ACCESS MEMORY

TECHNICAL FIELD

The present invention relates to a magnetic recording element available in a nonvolatile random access memory, and more particularly, to a method for read-out of information in a magnetic recording element using a magnetic vortex existing in a magnetic layer of a few micrometers in size.

BACKGROUND ART

In line with remarkable developments in an information and telecommunication field, there is an increasing demand for various kinds of memory devices. In particular, nonvolatile memory devices, which can retain data even if power is turned off, are demanded as memory devices available for mobile terminals, MP3 players, or the like. Since nonvolatile memory devices can electrically program and erase data, and retain data even though power is not supplied, they are increasingly applied to a variety of fields at present. However, typical dynamic random access memories (DRAMs) are volatile memory devices, and thus lose stored data when power is not supplied. Therefore, many studies are being conducted on nonvolatile memory devices which can be used in place of DRAMs.

Among various kinds of nonvolatile memory devices, researches are mainly being made on a phase RAM (PRAM) using a phase transition phenomenon, a magnetic RAM (MRAM) using a magnetoresistance, a ferroelectric RAM (FRAM) using a ferroelectric effect, and a resistance RAM (ReRAM) using a resistance switching or conductivity switching phenomenon of a metal oxide thin film. In particular, much attention has been paid on MRAMs recently because MRAMs have an operation speed faster than other nonvolatile memory devices, and excellent durability against the repetitive use.

MRAMs are classified into two memories according to a method for read-out of information, of which one is an MRAM using giant magnetoresistance (GMR) effect and the other is an MRAM using tunneling magnetoresistance (TMR) effect. Since the MRAM using the GMR effect has the magnetoresistance less than 10%, a reading speed of information is slow and a signal-to-noise ratio (SNR) is low. Also, the MRAM using the GMR effect may be affected by a magnetic field applied to adjacent magnetic recording elements, and thus the magnetic recording elements should be spaced apart from each other by a predetermined distance or more, leading to a difficulty in achieving high integration.

The MRAM using the TMR effect has a magnetic tunnel junction (MTJ) structure as a basic structure. The MTJ structure is a stack structure where a read electrode, an antiferromagnetic layer, a magnetic pinned layer formed of a ferromagnetic material, an insulating layer, a magnetic free layer formed of a ferromagnetic material, and a drive electrode are formed over a substrate in sequence. Like the MRAM using the GMR effect, the MRAM using the TMR effect stores information using a magnetoresistance difference according to a relative difference in magnetization direction between the magnetic free layer and the magnetic pinned layer. Unlike the MRAM using the GMR effect, however, the MRAM using the TMR effect has a faster reproduction rate and a higher SNR than the MRAM using the GMR effect because it has the magnetoresistance of 20% or more.

In the MRAM using the TMR effect, the resistance of each magnetic recording element greatly varies with a thickness of an insulating layer. Accordingly, information is stored by the use of a resistance difference from an adjacent comparative magnetic recording element at present. If, however, a thickness difference between an insulating layer of a storage magnetic recording element and an insulating layer of a comparative magnetic recording element is 0.2 Å or greater, it is difficult to read out information stored in the magnetic recording element. Therefore, there is a technical problem in that an insulating layer should be conformally formed over a wafer of several inches in radius during a manufacturing process.

As the magnetic recording element shrinks in size, the magnetic free layer and the magnetic pinned layer get close to each other. Therefore, a ferromagnet of the magnetic free layer is affected by a magnetic field of a ferromagnet of the magnetic pinned layer. Such a magnetic field produced by the magnetic pinned layer, that is, a stray field, may have a detrimental effect, for example, a decrease in magnetoresistance, or an increase in coercive force of the magnetic free layer. Especially, the insulating layer in the MTJ structure is thinner than the conductive layer of the MRAM using the GMR effect because the MTJ structure makes use of the TMR effect. Consequently, the magnetic free layer and the magnetic pinned layer get closer and closer to each other, and thus the magnetization of the magnetic free layer is greatly affected by the magnetic pinned layer.

DISCLOSURE OF INVENTION

Technical Problem

The present invention provides a method for read-out of information in a magnetic recording element using a magnetic vortex, and a method for read-out of information in a magnetic random access memory (MRAM), which can realize low power consumption and simple and convenient use characteristics, can write and read information within several nanoseconds or less, and can achieve high degree of integration above several Giga bytes per square inches

Technical Solution

According to an exemplary embodiment, a method for read-out of information in a magnetic recording element includes: preparing a magnetic recording element including a magnetic free layer where a magnetic vortex is formed; assigning "0" or "1" according to a core orientation of a magnetic vortex formed in the magnetic free layer; rotating the magnetic vortex core formed in the magnetic free layer on the magnetic free layer by applying a current or magnetic field, of which a direction varies with time, to the magnetic free layer with the magnetic vortex formed; and reading "0" or "1" assigned according to the core orientation of the magnetic vortex formed in the magnetic free layer by measuring a characteristic caused by a difference in a rotation radius of the magnetic vortex core, wherein the rotation radius of the magnetic vortex core that is formed in the magnetic free layer and rotates by the applied current or magnetic field varies with the core orientation of the magnetic vortex formed in the magnetic free layer.

According to another exemplary embodiment, a method for read-out of information in a magnetic random access memory (MRAM) includes: preparing an MRAM including magnetic recording elements arranged in rows and columns, each magnetic recording element including a read electrode, a magnetic pinned layer formed on the read electrode, an insulating layer formed on the magnetic pinned layer, a magnetic free layer formed on the insulating layer where a magnetic vortex is formed, and a plurality of drive electrode pairs disposed to form an ohmic contact with the magnetic free layer, wherein the respective magnetic recording elements form an array by sharing the read electrode and the drive electrode pair with the magnetic recording elements adjacent thereto; assigning "0" or "1" according to a core orientation of the magnetic vortex formed in the magnetic free layer included in the magnetic recording element; rotating the magnetic vortex core formed in the magnetic free layer included in the selected magnetic recording element on the magnetic free layer of the selected magnetic recording element by applying a voltage to the plurality of drive electrode pairs included in the selected magnetic recording element so as to apply a current of which a direction varies with time to the magnetic free layer included in the selected magnetic recording element that is selected to read out information; and reading "0" or "1" assigned to the selected magnetic recording element by measuring a TMR characteristic deduced from a current generated by applying a voltage between one electrode of the plurality of drive electrode pairs provided in the selected magnetic recording element and the read electrode provided in the selected magnetic recording element.

According to still another exemplary embodiment, a method for read-out of information in an MRAM includes: preparing an MRAM including magnetic recording elements arranged in rows and columns, each magnetic recording element including a read electrode, a magnetic pinned layer formed on the read electrode, a conductive layer formed on the magnetic pinned layer, a magnetic free layer formed on the conductive layer where a magnetic vortex is formed, and a plurality of drive electrode pairs disposed to form an ohmic contact with the magnetic free layer, wherein the respective magnetic recording elements form an array by sharing the read electrode and the drive electrode pair with the magnetic recording elements adjacent thereto; assigning "0" or "1" according to a core orientation of the magnetic vortex formed in the magnetic free layer included in the magnetic recording element; rotating the magnetic vortex core formed in the magnetic free layer included in the selected magnetic recording element on the magnetic free layer of the selected magnetic recording element by applying a voltage to the plurality of drive electrode pairs included in the selected magnetic recording element so as to apply a current of which a direction varies with time to the magnetic free layer included in the selected magnetic recording element that is selected to read out information; and reading "0" or "1" assigned to the selected magnetic recording element by measuring a GMR characteristic deduced from a current generated by applying a voltage between one electrode of the plurality of drive electrode pairs provided in the selected magnetic recording element and the read electrode provided in the selected magnetic recording element.

According to even another exemplary embodiment, a method for read-out of information in an MRAM includes: preparing an MRAM including magnetic recording elements arranged in rows and columns, each magnetic recording element including a read electrode, a magnetic pinned layer formed on the read electrode, an insulating layer formed on the magnetic pinned layer, a magnetic free layer formed on the insulating layer where a magnetic vortex is formed, and a plurality of drive electrodes formed on at least one of a top surface and undersurface of the magnetic free layer in configuration to cross each other, wherein the respective magnetic recording elements form an array by sharing the read electrode and the drive electrode with the magnetic recording elements adjacent thereto; assigning "0" or "1" according to a core orientation of the magnetic vortex formed in the magnetic free layer included in the magnetic recording element; rotating the magnetic vortex core formed in the magnetic free layer included in the selected magnetic recording element on the magnetic free layer of the selected magnetic recording element by applying a current to the plurality of drive electrodes included in the selected magnetic recording element so as to apply a magnetic field of which a direction varies with time to the magnetic free layer included in the selected magnetic recording element that is selected to read out information; and reading "0" or "1" assigned to the selected magnetic recording element by measuring a TMR characteristic deduced from a current generated by applying a voltage between one of the plurality of drive electrodes provided in the selected magnetic recording element and the read electrode provided in the selected magnetic recording element.

According to yet another exemplary embodiment, a method for read-out of information in an MRAM includes: preparing an MRAM including magnetic recording elements arranged in rows and columns, each magnetic recording element including a read electrode, a magnetic pinned layer formed on the read electrode, a conductive layer formed on the magnetic pinned layer, a magnetic free layer formed on the conductive layer where a magnetic vortex is formed, and a plurality of drive electrodes formed on at least one of a top surface and undersurface of the magnetic free layer in a configuration to cross each other, wherein the respective magnetic recording elements form an array by sharing the read electrode and the drive electrode with the magnetic recording elements adjacent thereto; assigning "0" or "1" according to a core orientation of the magnetic vortex formed in the magnetic free layer included in the magnetic recording element; rotating the magnetic vortex core formed in the magnetic free layer included in the selected magnetic recording element on the magnetic free layer of the selected magnetic recording element by applying a current to the plurality of drive electrodes included in the selected magnetic recording element so as to apply a magnetic field of which a direction varies with time to the magnetic free layer included in the selected magnetic recording element that is selected to read out information; and reading "0" or "1" assigned to the selected magnetic recording element by measuring a GMR characteristic deduced from a current generated by applying a voltage between one of the plurality of drive electrodes provided in the selected magnetic recording element and the read electrode provided in the selected magnetic recording element.

According to further exemplary embodiment, a method for read-out of information in an MRAM includes: preparing an MRAM including magnetic recording elements arranged in rows and columns, each magnetic recording element including a magnetic free layer with a magnetic vortex formed, a plurality of drive electrode pairs disposed to form an ohmic contact with the magnetic free layer, and a read line disposed around the magnetic free layer and through which a current generated by a voltage induced by the movement of a magnetic vortex core flows, wherein the respective magnetic recording elements form an array by sharing the drive electrode pair and the read electrode with the magnetic recording elements adjacent thereto; assigning "0" or "1" according to a core orientation of the magnetic vortex formed in the magnetic free layer included in the magnetic recording element; rotating the magnetic vortex core formed in the magnetic free layer included in the selected magnetic recording element on the magnetic free layer of the selected magnetic recording element by applying a voltage to the plurality of drive electrode pairs included in the selected magnetic recording element so as to apply a current of which a direction varies with time to the magnetic free layer included in the selected magnetic recording element that is selected to read out information; and reading "0" or "1" assigned to the selected magnetic recording element by measuring a difference in a variation rate of a current flowing through the read line provided in the selected magnetic recording element, the difference in the variation rate of the current being caused by a difference in a rotation radius of the magnetic vortex core formed in the magnetic free layer included in the selected magnetic recording element.

According to yet further exemplary embodiment, a method for read-out of information in an MRAM includes: preparing an MRAM including magnetic recording elements arranged in rows and columns, each magnetic recording element including a magnetic free layer with a magnetic vortex formed, a plurality of drive electrodes formed on at least one of a top surface and undersurface of the magnetic free layer in a configuration to cross each other, and a read line disposed around the magnetic free layer and through which a current generated by a voltage induced by the movement of a magnetic vortex core flows, wherein the respective magnetic recording elements form an array by sharing the drive electrode and the read electrode with the magnetic recording elements adjacent thereto; assigning "0" or "1" according to a core orientation of the magnetic vortex formed in the magnetic free layer included in the magnetic recording element; rotating the magnetic vortex core formed in the magnetic free layer included in the selected magnetic recording element on the magnetic free layer of the selected magnetic recording element by applying a current to the plurality of drive electrodes included in the selected magnetic recording element so as to apply a current of which a direction varies with time to the magnetic free layer included in the selected magnetic recording element that is selected to read out information; and reading "0" or "1" assigned to the selected magnetic recording element by measuring a difference in a variation rate of a current flowing through the read line provided in the selected magnetic recording element, the difference in the variation rate of the current being caused by a difference in a rotation radius of the magnetic vortex core formed in the magnetic free layer included in the selected magnetic recording element.

Advantageous Effects

According to a method for read-out of information in a magnetic recording element in accordance with the present invention, a rotation radius of a magnetic vortex core can be greatly increased selectively according to a core orientation of the magnetic vortex formed in a magnetic free layer of the magnetic recording element by applying a current or magnetic field, of which a direction varies with time, to the magnetic recording element, which makes it possible to accurately read information using low power.

According to a method for read-out of information in a magnetic random access memory (MRAM) in accordance with the present invention, it is easy to select a magnetic recording element from which information is to be read out, by the use of a current or magnetic field of which a direction varies with time.

BRIEF DESCRIPTION OF THE DRAWINGS

Exemplary embodiments can be understood in more detail from the following description taken in conjunction with the accompanying drawings, in which:

FIG. 1 is a schematic perspective view of a magnetic recording element used in a method for read-out of information according to an embodiment of the present invention;

FIG. 2 is a graph showing a variation of magnetization state formed in a magnetic layer according to the thickness and diameter of the magnetic layer when the magnetic layer is formed of permalloy, has a magnetic anisotropy (Ku) of '0' and has a disk shape;

FIGS. 3 and 4 are schematic perspective views illustrating a magnetization direction of a magnetic layer where a magnetic vortex is formed;

FIG. 5 is a schematic perspective view of a magnetic recording element used in a method for read-out of information according to another embodiment of the present invention;

FIG. 6 is a schematic perspective view of a magnetic recording element used in a method for read-out of information according to still another embodiment of the present invention;

FIG. 7 is a flowchart illustrating a method for read-out of information in a magnetic recording element according to an embodiment of the present invention;

FIG. 8 is a schematic view illustrating an electrode configuration of a magnetic recording element in a method for read-out of information in a magnetic recording element according to the present invention;

FIG. 9 is a graph showing a waveform of a voltage applied by an AC voltage source in FIG. 8;

FIGS. 10 through 12 illustrate a variation of a current flowing through a magnetic free layer over time, when the AC voltage of FIG. 9 is applied;

FIGS. 13 and 14 illustrate a result of a current applied to a magnetic free layer when a pulse-type voltage having a Gaussian distribution is applied through a drive electrode, in a method for read-out of information n a magnetic recording element according to the present invention;

FIGS. 15 through 17 illustrate a result of a current applied to a magnetic free layer when sine- or cosine-pulse type voltages having the same frequency and a predetermined phase difference are applied through a drive electrode, in a method for read-out of information n a magnetic recording element according to the present invention;

FIGS. 18 and 19 schematically illustrate a change in a magnetic vortex core when a circularly polarized current is applied to a magnetic layer where the magnetic vortex core is formed upward from a top surface of the magnetic layer;

FIG. 20 is a graph showing a rotation radius of a magnetic vortex core according to a frequency variation of an applied current when a left circularly polarized (LCP) current and a right circularly polarized (RCP) current are applied to a magnetic layer;

FIGS. 21 and 22 schematically illustrate a variation in a magnetic vortex core when a circularly polarized current is applied to a magnetic layer where the magnetic vortex core is formed downward from a top surface of the magnetic layer;

FIG. 23 is a graph showing a rotation radius of a magnetic vortex core according to a frequency variation of an applied current when an LCP current and an RCP current are applied to a magnetic layer;

FIG. 24 illustrates a case where a magnetic vortex is formed in a magnetic pinned layer and a current or magnetic field is not applied, in a method for read-out of in formation in a magnetic recording element according to the present invention;

FIG. 25 illustrates a variation of magnetization when a circularly polarized current or magnetic field is applied to a magnetic recording element having the magnetization state of FIG. 24, in a method for read-out of information of a magnetic recording element according to the present invention;

FIG. 26 is a graph showing a tunneling magnetoresistance (TMR) ratio versus time when a magnetic vortex is formed in a magnetic pinned layer, in a method for read-out of information in a magnetic recording element according to the present invention;

FIG. 27 illustrates a case where a magnetic single domain having a magnetization state arranged in parallel with a top surface of a magnetic pinned layer is formed in the magnetic pinned layer and a current or magnetic field is not applied, in a method for read-out of information in a magnetic recording element according to the present invention;

FIG. 28 illustrates a variation in magnetization after the lapse of a predetermined time from the application of a circularly polarized current or magnetic field to a magnetic recording element having the magnetization state of FIG. 27, in a method for read-out of information in a magnetic recording element according to the present invention;

FIG. 29 illustrates a variation in magnetization after the lapse of another predetermined time from the application of a circularly polarized current or magnetic field to a magnetic recording element having the magnetization of FIG. 27, in a method for read-out of information of a magnetic recording element according to the present invention;

FIG. 30 is a graph showing a TMR ratio versus time when a magnetic single domain having a magnetization state arranged in parallel with a top surface of a magnetic pinned layer is formed in the magnetic pinned layer, in a method for read-out of information in a magnetic recording element according to the present invention;

FIG. 31 is a flowchart illustrating a method for read-out of information in a magnetic recording element according to another embodiment of the present invention;

FIG. 32 is a schematic perspective view of a magnetic random access memory (MRAM) used in a method for read-out of information according to an embodiment of the present invention;

FIG. 33 is a schematic perspective view of an MRAM used in a method for read-out of information according to another embodiment of the present invention;

FIG. 34 is a schematic perspective view of an MRAM used in a method for read-out of information according to still another embodiment of the present invention;

FIG. 35 is a flowchart illustrating a method for read-out of information in an MRAM according to an embodiment of the present invention;

FIG. 36 illustrates a method for read-out of information in a selected magnetic recording element, in a method for read-out of information in an MRAM according to the present invention;

FIG. 37 illustrates a process of measuring a magnetoresistance to read information stored in a selected magnetic recording element, in a method for read-out of information in an MRAM according to the present invention; and FIG. 38 is a flowchart illustrating a method for read-out of information in an MRAM according to another embodiment of the present invention.

MODE FOR THE INVENTION

Hereinafter, a method for read-out of information in a magnetic recording element and a method for read-out of information in a magnetic random access memory (MRAM) according to preferred embodiments of the present invention will now be described more fully with reference to the accompanying drawings. The invention may, however, be embodied in many different forms and should not be construed as being limited to the embodiments set forth herein; rather, these embodiments are provided so that this disclosure will be thorough and complete, and will fully convey the concept of the invention to those skilled in the art.

FIG. 1 is a schematic perspective view of a magnetic recording element 100 used in a method for read-out of information according to an embodiment of the present invention.

Referring to FIG. 1, the magnetic recording element 100 according to the embodiment of the present invention includes a read electrode 110, a magnetic pinned layer 120, an insulating layer 130, a magnetic free layer 140 and drive electrodes 150a, 150b, 151a and 151b.

The read electrode 110 is shaped in a plate extending in a direction, and is used for reading information stored in the magnetic recording element 100. The read electrode 110 is composed of a bilayer of titanium (Ti) and gold (Au).

The magnetic pinned layer 120 is formed on the read electrode 110 in the shape of a disk. The magnetic pinned layer 120 is formed of an iron (Fe)-nickel (Ni) alloy, which is a ferromagnetic material and is called "permalloy". The magnetic pinned layer 120 provides a reference magnetization for reading information of the magnetic recording element. In order to provide the reference magnetization, a magnetic vortex or a magnetic single domain having a magnetization state arranged in parallel with a top surface of the magnetic pinned layer 120 may be formed in the magnetic pinned layer 120. The magnetization state formed in the magnetic pinned layer 120 is determined by the shape of the magnetic pinned layer 120. The variation in magnetization state formed in the magnetic layer according to the shape of the magnetic layer is shown in FIG. 2.

FIG. 2 is a graph showing a variation of magnetization state formed in a magnetic layer according to the thickness and diameter of the magnetic layer when the magnetic layer is formed of permalloy, has a magnetic anisotropy (Ku) of '0' and has a disk shape.

As shown in FIG. 2, the magnetization state of the magnetic layer having a disk shape is determined by the diameter and thickness of the magnetic layer. In a magnetic layer having the thickness and diameter corresponding to a region I of FIG. 2, a magnetic single domain having the magnetization state arranged in parallel with a top surface of the magnetic layer is formed. In a magnetic layer having the thickness and diameter corresponding to a region III of FIG. 2, a magnetic single domain having the magnetization state arranged in a direction perpendicular to the top surface of the magnetic layer is formed. In a magnetic layer having the thickness and diameter corresponding to a region II of FIG. 2, a magnetic vortex is formed.

Since the magnetic vortex or the magnetic single domain having the magnetization state arranged in parallel with the top surface of the magnetic pinned layer 120 is formed in the magnetic pinned layer 120, the magnetic pinned layer 120 has the thickness and diameter corresponding to the region I or II of FIG. 2.

The insulating layer 130 is formed on the magnetic pinned layer 120 in the same shape as that of the magnetic pinned layer 120, i.e., in the shape of a disk. The insulating layer 130 is formed to read out information stored in the magnetic recording element 100 using tunneling magnetoresistance (TMR) effect. Therefore, the insulating layer 130 is formed of magnesium oxide (MgO) showing good TMR effect. Also, to maximize a TMR difference, a cobalt (Co) thin film or cobalt (Co)-iron (Fe) alloy thin film (not shown) having a thickness of several nanometers may be formed between the magnetic pinned layer 120 and the insulating layer 130, and between the magnetic free layer 140 and the insulating layer 130.

The magnetic free layer 140 is formed on the insulating layer 130 in the same shape as that of the insulating layer 130, i.e., in the shape of a disk. Like the magnetic pinned layer 120, the magnetic free layer 140 is formed of a Fe—Ni alloy, which is a ferromagnetic material and is called "permalloy". The magnetic free layer 140 is formed so as to allow a magnetic vortex to be formed therein. That is, the magnetic free layer 140 is formed so as to have the thickness and diameter corresponding to the region II of FIG. 2.

The magnetization states of the magnetic free layer 140, which has the thickness and diameter corresponding to the region II of FIG. 2 and thus has a magnetic vortex formed therein, are schematically illustrated in FIGS. 3 and 4. A magnetic vortex 310 has a magnetic vortex core 320a, 320b having a magnetization component perpendicular to the top surface of the magnetic free layer 140 at a central portion of the magnetic free layer 140. The magnetic vortex 310 also has a parallel magnetization 330, which is a magnetization component formed around the magnetic vortex core 320a, 320b and rotating in a direction parallel to the top surface of the magnetic free layer 140. At this time, the core orientation of the magnetic vortex 310 is an upward direction 320a from the top surface of the magnetic free layer 140 as shown in FIG. 3 or is a downward direction 320b from the top surface of the magnetic free layer 140 as shown in FIG. 4. The parallel magnetization 330 formed around the magnetic vortex core 320a, 320b forms a concentric circle centering on the magnetic vortex core 320a, 320b.

When the magnetic free layer 140 is formed by adjusting the thickness and diameter such that the magnetic vortex 310 is formed, it is possible to record information according to the core orientation of the magnetic vortex formed in the magnetic free layer 140. That is, it is possible to record information as "1" if the core orientation of the magnetic vortex is an upward direction from the top surface of the magnetic free layer 140, and record information as "0" if the core orientation of the magnetic vortex is a downward direction from the magnetic free layer 140.

The drive electrodes 150a, 150b, 151a and 151b are formed in the shape of a plate extending in a direction. Like the read electrode 110, the drive electrodes 150a, 150b, 151a and 151b may be composed of a bilayer of Ti and Au. Of the drive electrodes 150a, 150b, 151a and 151b, the drive electrodes 150a and 150b form a drive electrode pair and the drive electrodes 151a and 151b form another drive electrode pair. The drive electrodes 150a, 150b, 151a and 151b are formed at intervals of 90 degrees along a circumferential direction of the magnetic free layer 140. The drive electrodes 150a, 150b, 151a and 151b and the magnetic free layer 140 are disposed so as to form an ohmic contact therebetween. Resultantly, when a voltage is applied to the drive electrode pairs 150 and 151, a current flows through the magnetic free layer 140.

While the present embodiment shows and describes that the drive electrodes 150a, 150b, 151a and 151b are formed at intervals of 90 degrees along a circumferential direction of the magnetic free layer 140 as shown in FIG. 1, the present invention is not limited thereto. For example, all the drive electrodes 150a, 150b, 151a and 151b may be formed at different angles other than 90 degrees along a circumferential direction of the magnetic free layer 140. Alternatively, the drive electrodes 150a, 150b, 151a and 151b may be disposed at side portions so as to form an ohmic contact with the magnetic free layer 140, or a plurality of drive electrode pairs may be formed so as to form an ohmic contact with the magnetic free layer 140. Also, three or more drive electrode pairs may be formed so as to form an ohmic contact with the magnetic free layer 140.

While the present embodiment shows and describes that the magnetic recording element 100 according to the present invention includes the insulating layer 130 between the magnetic pinned layer 120 and the magnetic free layer 140 and thus makes use of the TMR effect in case of reading information stored in the magnetic recording element 100, the present invention is not limited thereto. For instance, the magnetic recording element 100 may include a conductive layer instead of the insulating layer. The conductive layer is also formed between the magnetic pinned layer 120 and the magnetic free layer 140 in the same shape as that of the magnetic pinned layer 120, i.e., in the shape of a disk. The conductive layer is provided for using giant magnetoresistance (GMR) effect in case of reading information stored in the magnetic recording element 100. Accordingly, the conductive layer may be formed of copper (Cu) showing good GMR effect.

FIG. 5 is a schematic perspective view of a magnetic recording element used in a method for read-out of information according to another embodiment of the present invention.

Referring to FIG. 5, the magnetic recording element 400 according to another embodiment of the present invention includes a read electrode 410, a magnetic pinned layer 420, an insulating layer 430, a magnetic free layer 440 and drive electrodes 450 and 451.

The read electrode 410, the magnetic pinned layer 420, the insulating layer 430, and the magnetic free layer 440 correspond to the read electrode 110, the magnetic pinned layer 120, the insulating layer 130 and the magnetic free layer 140 included in the magnetic recording element 100 illustrated in FIG. 1, respectively. In the magnetic recording element 400 of FIG. 5, information is also stored in a core orientation of a magnetic vortex formed in the magnetic free layer 440.

The drive electrodes 450 and 451 may be formed in plurality such that they cross each other while covering a central portion of the top surface of the magnetic free layer 440. Desirably, the two drive electrodes 450 and 451 are disposed so as to cross each other at a right angle. The drive electrodes 450 and 451 may be composed of a bilayer of Ti and Au. When a current is applied through the drive electrodes 450 and 451, a magnetic field is applied to the magnetic free layer 440.

Although the embodiment of FIG. 5 shows and describes that the drive electrodes 450 and 451 cross each other at 90 degrees while covering the central portion of the top surface of the magnetic free layer 440, the present invention is not limited thereto. For example, one drive electrode may be disposed on the magnetic free layer 440 and the other drive electrode may be disposed beneath the magnetic free layer 440. In addition, the two drive electrodes 450 and 451 may be formed in a configuration to cross each other not at an angle of 90 degrees but at a different angle other than 90 degrees, or may be disposed in a configuration to cover not the central portion of the top surface but a peripheral portion of the magnetic free layer 440. Also, while the embodiment of FIG. 5 shows and describes that number of the drive electrodes is two, the present invention is not limited thereto. For example, three or more drive electrodes may be formed on at least one of a top surface and undersurface of the magnetic free layer 140 in a configuration to cross each other.

Like the magnetic recording element 100 illustrated in FIG. 1, the magnetic recording element 400 in FIG. 5 may include a conductive layer using the GMR effect instead of the insulating layer 430 using the TMR effect. The conductive layer included in the magnetic recording element 400 in FIG. 5 corresponds to the conductive layer described in FIG. 1.

FIG. 6 is a schematic perspective view of a magnetic recording element used in a method for read-out of information according to still another embodiment of the present invention.

Referring to FIG. 6, a magnetic recording element 500 according to still another embodiment of the present invention includes a magnetic free layer 540, drive electrodes 550a, 550b, 551a and 551b, and a read line 510.

The magnetic free layer 540 and the drive electrodes 550a, 550b, 551a and 551b respectively correspond to the magnetic free layer 140 and the drive electrodes 150a, 150b, 151a and 151b included in the magnetic recording element 100 in FIG. 1. In the magnetic recording element 500 of FIG. 6, information is also stored in a core orientation of a magnetic vortex formed in the magnetic free layer 540

The read line 510 extends in a direction and disposed around the magnetic free layer 540. When a predetermined current is applied to the magnetic free layer 540 through the drive electrodes 550a, 550b, 551a and 551b, the magnetic vortex formed in the magnetic free layer 540 moves. The movement of the magnetic vortex causes a magnetic field generated according to the position of a magnetic vortex core to be varied, thus generating an induced voltage in the read line 510. Resultantly, a current flows through the read line 510. Since the induced voltage generated in the read line 510 changes its magnitude and variation amount depending on information stored in the magnetic recording element, it is possible to detect information stored in the magnetic recording element 500 by measuring the current flowing through the read line 510.

The magnitude of the voltage induced by the movement of the magnetic vortex formed in the magnetic free layer 540 is in inverse proportion to the width of the read line 510. Accordingly, to increase the induced voltage, the width of the read line 510 may be equal to or smaller than the diameter of the magnetic free layer 540.

When the width of the read line 510 is smaller than the diameter of the magnetic free layer 540, the read line 510 may be spaced apart from the center of the magnetic free layer 540. This is because the magnetic vortex formed in the magnetic free layer 540 moves only at one side of the read line 510 when a rotation radius of the magnetic vortex formed in the magnetic free layer 540 is small. By virtue of the above-described configuration, a difference in the induced voltage according to the rotation radius of the magnetic vortex formed in the magnetic free layer 540 becomes greater.

FIG. 7 is a flowchart illustrating a method for read-out of information in a magnetic recording element according to an embodiment of the present invention. For reference, while following description will be made that the method for read-out of information in the magnetic recording element is realized using the magnetic recording elements 100 and 400 illustrated in FIGS. 1 and 5, other magnetic recording elements may be available if they have a magnetic free layer where a magnetic vortex is formed.

Referring to FIG. 7, in operation S2010, the magnetic recording element 100, 400 including the magnetic free layer 140, 440 where the magnetic vortex is formed is prepared first. As aforementioned, since information is recorded as "0" or "1" according to the core orientation of the magnetic vortex of the magnetic free layer 140, 440, the magnetic recording element 100, 400 having the magnetic free layer 140, 440 of FIG. 3 or 4 in which the magnetic vortex is formed should be prepared. Accordingly, the magnetic free layer 140, 440 should be designed so as to have the thickness and diameter corresponding to the region II of FIG. 2.

Next, in operation S2020, "0" or "1" is assigned depending on the core orientation of the magnetic vortex formed in the magnetic free layer 140, 440. For example, "0" may be assigned in the case where the core orientation of the magnetic vortex formed in the magnetic free layer 140, 440 is a downward direction from the top surface of the magnetic free layer 140, 440, whereas "1" may be assigned in the case where the core orientation of the magnetic vortex is an upward direction from the top surface of the magnetic free layer 140, 440.

Thereafter, in operation S2030, the magnetic vortex core formed in the magnetic free layer 140, 440 rotates on the magnetic free layer by applying a current or magnetic field of which a direction varies with time to the magnetic free layer 140, 440.

When magnetic vortices are formed in both the magnetic free layer 140, 440 and the magnetic pinned layer 120, 420, information stored in the magnetic recording element can be read by measuring a magnetoresistance difference caused by the relative difference in the perpendicular magnetization direction between the magnetic vortex cores formed in the magnetic free layer 140, 440 and the magnetic pinned layer 120, 420. However, an occupation area of the magnetic vortex core is very small, e.g., a few percentage, in each of the magnetic free layer 140, 440 and the magnetic pinned layer 120, 420, and thus the magnetoresistance difference in the magnetic vortex cores formed the magnetic free layer 140, 440 and the magnetic pinned layer 120, 420 is also small. Therefore, it is difficult to detect the core orientation of the magnetic vortex using such a small magnetoresistance difference.

Meanwhile, when a current or magnetic field is applied to the magnetic free layer 140, 440, the magnetic vortex core formed in the magnetic fee layer 140, 440 rotates. However, when a current or magnetic field without a change in direction, for example, a linearly polarized current or linearly polarized magnetic field is applied, the magnetic vortex formed in the magnetic free layer 140, 440 rotates constantly regardless of the core orientation of the magnetic vortex formed in the magnetic fee layer 140, 440. Therefore, since the core orientation of the magnetic vortex formed in the magnetic free layer 140, 440 cannot be detected if the current or magnetic field without a change in direction is applied, information stored in the magnetic recording element cannot be read. In contrast, when a current or magnetic field of which a direction varies with time is applied to the magnetic free layer 140, 440, a rotation radius of the magnetic vortex core varies according to the core orientation of the magnetic vortex formed in the magnetic free layer 140, 440. This makes it possible to read information stored in the magnetic recording element 100, 400 by measuring characteristics resulting from a difference in a rotation radius.

In the present embodiment, therefore, a current or magnetic field of which a direction varies with time is applied to the magnetic free layer 140, 440 to thereby cause the magnetic vortex core formed in the magnetic free layer 140, 440 to move. This movement of the magnetic vortex core dynamically generates a parallel magnetization difference between the magnetic free layer 140, 440 and the magnetic pinned layer 120, 420. Consequently, information can be read by measuring the magnetoresistance resulting from the parallel magnetization difference.

To this end, the direction of an applied current may continue to vary with time. The current of which a direction continuously varies on a single plane may be applied, and this plane may be parallel with the top surface of the magnetic free layer 140. Alternatively, a current of which a period is constant but a direction varies with time, or a current of which a direction continuously varies but amplitude is always constant may be applied. Also, a current whose direction varies with pulsed time may be applied. Desirably, in the case where the magnetic free layer 140 is formed in the shape of an elliptical plate or a rectangular plate, an elliptically polarized current, which rotates along a plane parallel with the top surface of the magnetic free layer 140, may be applied to the magnetic free layer 140. Likewise, in the case where the magnetic free layer 140 is formed in the shape of a disk or square plate, a circularly polarized current, which rotates along a plane parallel with the top surface of the magnetic free layer 140, may be applied to the magnetic free layer 140.

The elliptically polarized current is a current of which an amplitude and a direction trace over time are shaped in an ellipsoid, and the circularly polarized current is a current of which an amplitude and a direction trace over time are shaped in a circle. The circularly polarized current is a specific type of the elliptically polarized current, and its amplitude is constant regardless of a time variation. The elliptically polarized current or the circularly polarized current has a constant frequency.

Methods of applying the elliptically polarized current and the circularly polarized current are illustrated in FIG. 8 and FIG. 9, respectively.

FIG. 8 is a schematic view illustrating an electrode configuration of a magnetic recording element in a method for read-out of information in the magnetic recording element according to the present invention. FIG. 9 is a graph showing a waveform of a voltage applied by an AC voltage source in FIG. 8.

Referring to FIGS. 8 and 9, the magnetic recording element has an electrode configuration shown in FIGS. 1 and 8 so as to apply a current to the magnetic free layer 140 thereof. That is, four electrodes 150*a*, 150*b*, 151*a* and 151*b*, which are in ohmic contacted with the magnetic free layer 140, are disposed at intervals of 90 degrees in a circumferential direction of the top surface of the magnetic free layer 140. Of four electrodes 150*a*, 150*b*, 151*a* and 151*b*, one pair of two electrodes facing each other and indicated by reference numerals 150*a* and 150*b* in FIG. 8 and another pair of two electrodes indicated by reference numerals 151*a* and 151*b* in FIG. 8 are connected to the AC voltage source. For the convenience in description, the two electrodes 150*a* and 150*b* of FIG. 8 are called a first drive electrode pair and the two electrodes 151*a* and 151*b* of FIG. 8 are called a second drive electrode pair.

When sine- or cosine-wave voltages having the same frequency and a predetermined phase difference are applied to the first drive electrode pair 150*a* and 150*b* and the second drive electrode pair 151*a* and 151*b*, an elliptically polarized current flows through the magnetic free layer 140. For example, when sine- or cosine-wave voltages having the same frequency and a phase difference of 90 degrees and having different amplitudes or sine- or cosine-wave voltages having the same frequency and amplitude and having a phase difference other than 90 degrees are applied to the first drive electrode pair 150*a* and 150*b* and the second drive electrode pair 151*a* and 151*b*, an elliptically polarized current flows through the magnetic free layer 140.

When sine- or cosine-wave voltages having the same frequency and amplitude but having a phase difference of 90 degrees are applied to the first drive electrode pair 150*a* and 150*b* and the second drive electrode pair 151*a* and 151*b*, a circularly polarized current flows through the magnetic free layer 140. One example for applying a circularly polarized current to the magnetic free layer 140 is shown in FIG. 9.

Referring to FIG. 9, a sine-wave AC voltage indicated by reference numeral 1010 of FIG. 9 is applied to the first drive electrode pair 150*a* and 150*b*, and a cosine-wave AC voltage indicated by reference numeral 1020 of FIG. 12 is applied to the second drive electrode pair 151*a* and 151*b*. As illustrated in FIG. 9, the sine-wave AC voltage indicated by reference numeral 1010 and the cosine-wave AC voltage indicated by reference numeral 1020 have the same frequency and amplitude but have a phase difference of 90 degrees therebetween.

Variations of a current flowing in the magnetic free layer 140 over time when the AC voltage shown in FIG. 9 is applied to the first drive electrode pair 150*a* and 150*b* and the second drive electrode pair 151*a* and 151*b*, respectively, are shown in FIGS. 10 through 12.

FIG. 10 illustrates the case where a potential difference of +0.2 V is applied to the second drive electrode pair 151*a* and 151*b* and a potential difference of 0 V is applied to the first drive electrode pair 150*a* and 150*b*. In order to apply the potential difference of +0.2 V to the second drive electrode pair 151*a* and 151*b*, +0.1 V is applied to the left electrode 151*b* of the second drive electrode pair 151*a* and 151*b* and −0.1 V is applied to the right electrode 151*a*. The direction of arrows shown in FIG. 10 indicates directions of a current at those portions. At this time, since any voltage is not applied through the first drive electrode pair 150*a* and 150*b*, a total current flowing through the magnetic free layer 140 is directed from the left to the right, and a direction perpendicular to the direction of the total current is indicated by reference numeral 1110, which is defined as '0°'.

FIG. 11 illustrates the case where a potential difference of +0.152 V is applied to the second drive electrode pair 151*a* and 151*b* and a potential difference of +0.1 V is applied to the first drive electrode pair 150*a* and 150*b* as time elapses. In order to apply the potential difference of +0.152 V to the second drive electrode pair 151*a* and 151*b*, +0.086 V is applied to the left electrode 151*b* of the second drive electrode pair 151*a* and 151*b* and −0.086 V is applied to the right electrode 151*a*. In order to apply the potential difference of +0.1 V to the first drive electrode pair 150*a* and 150*b*, +0.05 V is applied to the upper electrode 150*a* of the first drive electrode pair 150*a* and 150*b* and −0.05 V is applied to the lower electrode 150*b*. At this time, a direction perpendicular to the direction of a total current flowing through the magnetic free layer 140 is indicated by reference numeral 1120, which rotates by 30 degrees clockwise, compared with the direction 1110 of FIG. 10.

FIG. 12 illustrates the case where a potential difference of +0.142 V is applied to both the first drive electrode pair 150*a* and 150*b* and the second drive electrode pair 151*a* and 151*b* as time further elapses. In order to apply the potential difference of +0.142 V to the first drive electrode pair 150*a* and 150*b*, +0.071 V is applied to the upper electrode 150*a* of the first drive electrode pair 150*a* and 150*b* and −0.071 V is applied to the lower electrode 150*b*. In order to apply a potential difference of +0.142 V, +0.071 V is applied to the left electrode 151*b* of the second drive electrode pair 151*a* and 151*b* and −0.071 V is applied to the right electrode 151*a*. At this time, a direction perpendicular to the direction of a current flowing through the magnetic free layer 140 is indicated by reference numeral 1130, which rotates by 45 degrees clockwise, compared with the direction 1110 of FIG. 10.

As time continues to elapse further and further, the direction of the current further rotates in a clockwise direction. At this time, since the intensity of the current is not changed, a circularly polarized current is generated. At this time, the frequency of the circularly polarized current is the same as that of the voltage applied to the first drive electrode pair 150*a* and 150*b* and the second drive electrode pair 151*a* and 151*b*. Herein, a circularly polarized current rotating clockwise at a constant frequency on a plane parallel with the top surface of the magnetic free layer 140 is called a right circularly polarized (RCP) current. On the contrary, when a cosine-wave voltage is applied to the first drive electrode pair 150*a* and 150*b* and a sine-wave voltage is applied to the second drive electrode pair 151*a* and 151*b*, it is possible to apply a circularly polarized current rotating counterclockwise to the magnetic free layer 140. Herein, a circularly polarized current rotating counterclockwise at a constant frequency on a plane parallel with the top surface of the magnetic free layer 140 is called a left circularly polarized (LCP) current.

It is possible to apply a circularly polarized current to the magnetic free layer 140 through the aforementioned method. Instead of continuing to apply a voltage, it is also possible to apply a pulse-type voltage. For example, a pulse-type voltage having a Gaussian distribution may be applied to the first drive electrode pair 150*a* and 150*b* and the second drive electrode pair 151*a* and 151*b* at different timings. It is noted that the pulse voltage applied to the first drive electrode pair 150*a* and 150*b* and the second drive electrode pair 151*a* and 151*b* should be applied together for a predetermined duration. If there no exists time applied together, a current whose direction does not vary with time may be applied.

FIGS. 13 and 14 illustrate an exemplary case where a current whose direction varies with time is applied to the magnetic free layer 140 by applying a pulse-type voltage having a Gaussian distribution to the first drive electrode pair 150*a* and 150*b* and the second drive electrode pair 151*a* and 151*b*.

FIG. 13 illustrates a case where a pulse-type voltage having a Gaussian distribution indicated by reference numeral 4410*a* is applied to the first drive electrode pair 150*a* and 150*b* and a pulse-type voltage having a Gaussian distribution indicated by reference numeral 4420*a* is applied to the second drive electrode pair 151*a* and 151*b*. When voltages are applied in this way, a current having a configuration rotating counterclockwise is applied to the magnetic free layer 140 as shown in the right side of FIG. 13. FIG. 14 illustrates a case where a pulse-type voltage having a Gaussian distribution indicated by reference numeral 4410*b* is applied to the first drive electrode pair 150*a* and 150*b* and a pulse-type voltage having a Gaussian distribution indicated by reference numeral 4420*b* is applied to the second drive electrode pair 151*a* and 151*b*. When voltages are applied as in this way, a current having a configuration rotating clockwise is applied to the magnetic free layer 140 as shown in the right side of FIG. 14.

At this time, the amplitude and direction trace of current applied to the magnetic free layer 140 over time approach a circular form when the pulse-type voltages having the same Gaussian distribution are applied. That is, when an average value and a full width at half maximum (FWHM) of the two Gaussian distributions are the same, the amplitude and direction trace of current applied to the magnetic free layer 140 over time approach a circular form. Also, when voltages having two Gaussian distributions are applied at a time interval of 0.6671 times the FWHM, the magnitude and direction trace of current applied to the magnetic free layer 140 over time approach a circular shape. It is possible to apply a pulse type voltage having a Gaussian distribution matched with the shape of the magnetic free layer 140 using the above characteristics. For example, in the case where the magnetic free layer 140 is formed in the shape of a disk, a current having a trace close to a circular shape may be applied to the magnetic free layer 140. Therefore, voltages having two Gaussian distributions in which an average value is equal to FWHM are applied at a time interval of 0.6671 times FWHM.

Sine- or cosine-pulse type voltages having the same frequency and a phase difference may be applied to the first drive electrode pair 150*a* and 150*b* and the second drive electrode pair 151*a* and 151*b*. The application of the voltages as above provides the same result of applying an elliptically polarized current or a circularly polarized current for a predetermined time. One example for applying voltages as above is shown in FIGS. 15 through 17.

FIG. 15 schematically illustrates the case where a sine pulse having a half period and indicated by reference numeral 1210*a* is applied to the second drive electrode pair 151*a* and 151*b* and a sine pulse having a half period and indicated by reference numeral 1220*a* is applied to the first drive electrode pair 150*a* and 150*b*. When voltages are applied in this way, a circularly polarized current rotating counterclockwise by 90 degrees is applied to the magnetic free layer 140 as shown in the right side of FIG. 15. FIG. 16 schematically illustrates the case where a sine pulse having one period and indicated by reference numeral 1210*b* is applied to the second drive electrode pair 151*a* and 151*b* and a sine pulse having one period and indicated by reference numeral 1220*b* is applied to the first drive electrode pair 150*a* and 150*b*. When voltages are applied in this manner, a circularly polarized current rotating counterclockwise by 270 degrees is applied to the magnetic free layer 140 as shown in the right side of FIG. 16. FIG. 17 schematically illustrates the case where a sine pulse having one and half period and indicated by reference numeral 1210*c* is applied to the second drive electrode pair 151*a* and 151*b* and a sine pulse having one and half period and indicated by reference numeral 1220*c* is applied to the first drive electrode pair 150*a* and 150*b*. When voltages are applied as in this manner, a circularly polarized current rotating counterclockwise by 450 degrees is applied to the magnetic free layer 140 as shown in the right side of FIG. 17.

While the above embodiments show and describe a magnetic recording element having two drive electrode pairs in a way to apply to the magnetic free layer 140 a current whose direction varies with time, the present invention is not limited thereto. For example, a magnetic recording element having three or more drive electrode pairs is also similar to the above. However, it is noted that frequencies of applied voltages in all the drive electrode pairs are preferably the same, the drive electrodes are formed along a circumference of the magnetic free layer 140 so as to apply a circularly polarized current, and a voltage having a constant phase difference should be applied to each of the drive electrode pairs.

Hitherto, while a method of applying the elliptically polarized current or the circularly polarized current to the magnetic free layer is shown and described, the application of the elliptically polarized magnetic field or the circularly polarized magnetic field to the magnetic free layer provides the similar effect as the above.

However, to apply a magnetic field to the magnetic free layer, the configuration of the drive electrode should differ from that of the drive electrode used to apply the current to the magnetic free layer. The configuration of the drive electrode for applying the magnetic field to the magnetic free layer is illustrated in FIG. 5. As illustrated in FIG. 5, the drive electrode for applying the magnetic field to the magnetic free layer may be configured such that a plurality of drive electrodes are formed on at least one of a top surface and undersurface of the magnetic free layer 440 in a configuration to cross each other. For example, the drive electrodes 450 and 451 are disposed to cross each other at 90 degrees on the magnetic free layer 440, as illustrated in FIG. 5. When a current is applied to each of the drive electrodes 450 and 451, a magnetic field is applied to the magnetic free layer 440.

When sine- or cosine-wave currents, which have the same frequency and have a predetermined phase difference therebetween, are applied to the two drive electrodes 450 and 451, an elliptically polarized magnetic field is applied to the magnetic free layer 440. That is, when sine- or cosine-wave currents having the same frequency, a phase difference of 90 degrees and different amplitudes are applied to the two drive electrodes 450 and 451, or when sine- or cosine-wave currents having the same frequency and amplitude and a phase difference of 90 degrees, are applied to the two drive electrodes 450 and 451, an elliptically polarized magnetic field is applied to the magnetic free layer 440. However, when sine- or cosine-wave currents having the same frequency and amplitude and a phase difference of 90 degrees are applied to the two drive electrodes 450 and 451, a circularly polarized magnetic field is applied to the magnetic free layer 440.

Furthermore, when sine- or cosine-pulse type currents, which have the same frequency and a predetermined phase difference therebetween, are applied to the two drive electrodes 450 and 451, or when two pulse-type currents having a predetermined time interval are applied, a pulsed magnetic field of which a direction varies with time may be applied to the magnetic free layer 440. In this case, the two pulse-type currents should be applied together for at least predetermined duration.

When the circularly polarized current or circularly polarized magnetic field is applied through the above-described method, a rotation radius of the magnetic vortex varies according to the core orientation of the magnetic vortex formed in the magnetic free layer 140, 440.

FIGS. 18 and 19 are schematic views illustrating variations of a magnetic vortex core when a circularly polarized current is applied to a magnetic layer in which the magnetic vortex core is formed upward from the top surface thereof. Specifically, FIG. 18 is a case where an LCP current is applied, and FIG. 19 is a case where an RCP current is applied. In respective cases, frequencies and magnitudes of applied currents are the same.

As illustrated in FIGS. 18 and 19, it can be seen that the case where the LCP current is applied to the magnetic layer in which the magnetic vortex core having formed upward core orientation from the top surface thereof has a rotation radius much greater than the case where the RCP current is applied. At this time, a rotation radius of the magnetic vortex core versus a frequency variation is shown in FIG. 20. The diameter of the used magnetic layer is 300 nm. The X-axis corresponds to values normalizing a frequency of an applied current with an eigenfrequency of the magnetic vortex core formed in the magnetic layer. The eigenfrequency ($v_0$) of the magnetic vortex is defined as the following Equation 1:

$$V_0 = \frac{1}{4\pi} \gamma M_s \frac{\xi^2}{\chi(0)} \quad \text{(Equation 1)}$$

where $M_s$ is a saturation magnetization of the magnetic layer, $\chi(0)$ is an initial susceptibility, $\gamma$ is a gyromagnetic ratio, and is a proportional constant. Since the gyromagnetic ratio and the proportional constant are constant values regardless of the forming material and shape of the magnetic layer, the eigenfrequency of the magnetic vortex is inversely proportional to the initial susceptibility of the magnetic layer in which the magnetic vortex is formed and is proportional to the square of saturation magnetization. The initial susceptibility is determined by the shape of the magnetic layer, and the saturation magnetization is determined by the forming material of the magnetic layer.

The curve indicated by reference numeral 1410 of FIG. 20 corresponds to a case where an LCP current having a magnitude of 0.8 mA is applied, and the curve indicated by reference numeral 1420 of FIG. 20 corresponds to a case where an RCP current having a magnitude of 0.8 mA is applied. As shown in FIG. 20, the case where the LCP current is applied to the magnetic layer is greater in rotation radius of the magnetic vortex core than the case where the RCP current is applied. In particular, when the same frequency as the eigenfrequency of the magnetic vortex is applied, it is easy to determine information because a difference in rotation radius is great.

However, when the core orientation of the magnetic vortex is downward direction from the top surface of the magnetic layer, the result is opposed to that of the aforesaid case, which is illustrated in FIGS. 21 through 23.

FIG. 21 schematically illustrates a variation in a magnetic vortex core when an LCP current is applied, and FIG. 22 schematically illustrates a variation in a magnetic vortex core when an RCP current is applied. FIG. 23 is a graph showing a rotation radius of a magnetic vortex core versus a frequency variation. In FIG. 23, reference numeral 1710 denotes the case of applying the RCP current, and reference numeral 1720 denotes the case of applying the LCP current.

In contrast to the case where the core orientation of the magnetic vortex is an upward direction from the top surface of the magnetic layer, the case (FIG. 21) of applying the LCP current to the magnetic layer is much smaller in rotation radius than the case (FIG. 22) of applying the RCP current to the magnetic layer. At all frequencies, as illustrated in FIG. 2, the case (see 1720 in FIG. 23) of applying the LCP current is smaller in a rotation radius than the case (see 1710 in FIG. 23) of applying the RCP current. Like the case of FIG. 20, a difference in a rotation radius becomes great when the current having a frequency near the magnetic vortex is applied.

Although the aforesaid embodiment shows and describes the difference in the rotation radius according to the core orientation of the magnetic vortex when a circularly polarized current is applied, the application of a circularly polarized magnetic field is also similar to the above.

In the result, when a circularly current or a circularly magnetic field is applied to the magnetic free layer 140, 440, the rotation radius of the magnetic vortex core varies according to the core orientation of the magnetic vortex formed in the magnetic free layer 140, 440. The difference in rotation radius of the magnetic vortex core is maximized when a current or magnetic field having a frequency equal to an eigenfrequency of the magnetic vortex core is applied. Therefore, the circularly polarized current or the circularly polarized magnetic field having the frequency equal to the eigenfrequency of the magnetic vortex may be applied to the magnetic free layer 140, 440.

However, the core orientation of the magnetic vortex formed in the magnetic free layer 140, 440 should not be switched in order that information stored in the magnetic recording element 100, 400 is not changed. Therefore, a speed of the magnetic vortex core formed in the magnetic free layer 140, 440 should not exceed a critical speed allowing the core orientation of the magnetic vortex to be switched, while applying the circularly polarized current or the circularly polarized magnetic field.

That is, information stored in the magnetic recording element 100, 400 is read using characteristics resulting from a difference in rotation radius of the magnetic vortex core generated by applying a circularly current or a circularly magnetic field, which has a frequency equal to an eigenfrequency of the magnetic vortex and a speed less than the critical speed switching the core orientation of the magnetic vortex, to the magnetic free layer 140, 440. However, it is desirable to read out information assigned to the magnetic recording element as "0" or "1" by measuring a physical quantity that is easily measurable among various characteristics resulting from the difference in rotation radius of the magnetic vortex core rather than by directly measuring the difference in rotation radius of the magnetic vortex core formed in the magnetic free layer 140, 440. In the present embodiment, information stored in the magnetic recording element 100, 400 is read by measuring a magnetoresistance that is easily measurable.

To this end, a magnetic pinned layer 2220 is required to provide a reference magnetization, as illustrated in FIG. 24. As described above, to maximize a magnetoresistance difference caused by a relative difference in a magnetization state between a magnetic free layer 2240 and the magnetic pinned layer 2220, an insulating layer 2230 is formed between the magnetic free layer 2240 and the magnetic pinned layer 2220, and TMR effect is then measured. As illustrated in FIG. 24, like the magnetic free layer 2240, the magnetic vortex is also formed in the magnetic pinned layer 2220. In this case, the magnetic pinned layer 2220 is formed so as to have the thickness and diameter corresponding to the region II of FIG. 2 such that the magnetic vortex is formed in the magnetic pinned layer 2220. As illustrated in FIGS. 3 and 4, when the magnetic vortices are formed in the magnetic free layer 2240 and the magnetic pinned layer 2220, the perpendicular magnetization is formed at the magnetic vortex core, and the parallel magnetization is formed around the magnetic vortex core. The parallel magnetization is arranged in such a configuration that it rotates clockwise or counter-clockwise around an axis of the magnetic vortex core.

FIG. 24 illustrates a state before a current or magnetic field is applied to the magnetic free layer 2240, and FIG. 25 illustrates a momentary state when a magnetic vortex core rotates by applying a circularly polarized current or a circularly polarized magnetic field to the magnetic free layer 2240 of the magnetic recording element having the structure of FIG. 24.

In FIG. 24, the magnetic vortices are formed in both the magnetic free layer 2240 and the magnetic pinned layer 2220, core orientations of the both magnetic vortices are an upward direction, and parallel magnetization directions are a counterclockwise direction. As illustrated in FIG. 24, there is no relative difference in parallel magnetization before the circularly polarized current or the circularly polarized magnetic field is applied.

However, when the magnetic vortex core rotates by applying the circularly polarized current or the circularly polarized magnetic field to the magnetic free layer 2240 as illustrated in FIG. 25, there exists a relative difference in parallel magnetization. In particular, there is a great difference in parallel magnetization between the magnetic free layer 2240 and the magnetic pinned layer 2220 at the portion indicated by reference numeral 2310. That is, when the rotation radius of the magnetic vortex core formed in the magnetic free layer 2240 increases, a relative difference in parallel magnetization between the magnetic free layer 2240 and the magnetic pinned layer 2220 becomes great in comparison with the case of a small rotation radius. Accordingly, the magnetoresistance resulting from the relative difference in magnetization state between the magnetic free layer 2240 and the magnetic pinned layer 2220 also increases, so that it is possible to read information stored in the magnetic recording element 100 by virtue of the difference in rotation radius of the magnetic vortex core.

At this time, the circularly polarized current or magnetic field applied to the magnetic free layer 2240 also affects the magnetic pinned layer 2220, and thus the magnetic vortex core formed in the magnetic pinned layer 2220 can also rotate. However, the magnetic pinned layer 2220 provides a reference magnetization, and thus the magnetic pinned layer 2220 should be formed so as not to change its magnetization direction, or formed so as to change its magnetization direction slightly even if the magnetization direction of the magnetic pinned layer 2220 is changed.

As illustrated in FIGS. 20 and 23, the rotation radius of the magnetic vortex core formed in the magnetic free layer 2240 is related to a frequency of an applied current or magnetic field. Particularly, the rotation radius severely varies near the eigenfrequency of the magnetic vortex core. Compared to the case of applying a current or magnetic field having a frequency equal to the eigenfrequency of the magnetic vortex, the rotation radius of the magnetic vortex core is significantly decreased even under the same conditions in the case of applying a current or magnetic field having a frequency differing from the eigenfrequency of the magnetic vortex.

Therefore, the eigenfrequency of the magnetic vortex formed in the magnetic pinned layer 2220 may differ from that of the magnetic vortex formed in the magnetic free layer 2240. Resultantly, when the frequency of the applied current or magnetic field is equal to the eigenfrequency of the magnetic vortex formed in the magnetic free layer 2240, a current or magnetic field having a frequency different from the eigenfrequency of the magnetic vortex core formed in the magnetic pinned layer 2220 is applied to the magnetic pinned layer 2220. Consequently, the magnetic vortex core formed in the magnetic pinned layer 2220 is not greatly affected by the current or magnetic field applied to rotate the magnetic vortex core formed in the magnetic free layer 2240.

As described above, a saturation magnetization value or an initial susceptibility of the magnetic layer should differ from each other in order that the magnetic vortex formed in the magnetic free layer 2240 may differ in eigenfrequency from the magnetic vortex formed in the magnetic pinned layer 2220. The initial susceptibility is related to the shape of the magnetic layer, and the saturation magnetization value is related to a material forming the magnetic layer. Therefore, the magnetic free layer 2240 should differ in at least one of constitution material, thickness and diameter from the magnetic pinned layer 2220. In particular, the thicknesses of the magnetic free layer 2240 and the magnetic pinned layer 2220 may differ from each other because the thickness control is easy and simple.

Afterwards, in operation S2040, a TMR deduced from the difference in amplitude of current caused by the relative difference in parallel magnetization direction is measured by applying a voltage between the magnetic free layer 140, 440 and the magnetic pinned layer 120, 420, and then "0" or "1" assigned according to the core orientation of the magnetic vortex is read out. When a circularly polarized current or a circularly polarized magnetic field is applied so as to allow only the magnetic vortex core formed in the magnetic free layer 140, 440 to rotate while not changing the magnetic vortex core formed in the magnetic pinned layer 120, 420, a relative difference in parallel magnetization occurs depending on the core orientation of the magnetic vortex, as described above. This relative difference in parallel magnetization direction leads to a magnetoresistance difference. The magnetoresistance difference is deduced from a difference in amplitude of current obtained by applying a voltage between the magnetic free layer 140, 440 and the magnetic pinned layer 120, 420. To obtain the current difference due to the magnetoresistance difference, the voltage applied between the magnetic pinned layer 120, 420 and the magnetic free layer 140, 440 may be a direct current (DC) voltage.

Such a magnetoresistance difference is illustrated in FIG. 26. The magnetoresistance value is expressed as a TMR ratio. The insulating layer 130, 140 is used to increase the TMR effect, and magnesium oxide is used for the insulating layer 130, 140 in the present embodiment. FIG. 26 is a graph showing a TMR ratio versus time when an LCP current or magnetic field is applied under conditions that the magnetic vortices are formed in both the magnetic free layers 140, 440 and the magnetic pinned layers 120, 420, and the parallel magnetizations formed around the magnetic vortex cores rotate counterclockwise. In FIG. 26, a straight line indicated by reference numeral 2410 denotes the case where the core orientation of the magnetic vortex formed in the magnetic layer 140, 440 is an upward direction, whereas a straight line indicated by reference numeral 2420 denotes the case where the core orientation of the magnetic vortex formed in the magnetic layer 140, 440 is a downward direction.

When the core orientation of the magnetic vortex formed in the magnetic free layer 140, 440 is the upward direction, the application of the LCP current or magnetic field increases the rotation radius, as described above. Accordingly, a magnetoresistance difference increases so that the TMR ratio increases as shown in the straight line 2410 in FIG. 26. On the contrary, when the core orientation of the magnetic vortex formed in the magnetic free layer 140, 440 is the downward direction, the TMR ratio decreases due to the decrease in rotation radius, as shown in the straight line 2420 in FIG. 26. Through the magnetoresistance difference, i.e., a difference in TMR ratio, it is possible to detect the core orientation of the magnetic vortex formed in the magnetic free layer 140, 440.

Following description will be made on one example of reading information by measuring a TMR when the magnetic vortex is formed in the magnetic pinned layer 2520. To begin with, the case where the core orientation of the magnetic vortex formed in the magnetic free layer 140, 440 is the upward direction is assigned "1", and the case where the core orientation of the magnetic vortex formed in the magnetic free layer 140, 440 is the downward direction is assigned "0". The magnetic pinned layer 120, 420 is formed such that the core orientation of the magnetic vortex formed in the magnetic pinned layer 120, 420 is identical in the core orientation of the magnetic vortex core of the magnetic free layer 140, 440. Furthermore, the magnetic pinned layer 120, 420 is formed such that the parallel magnetization direction of the magnetic pinned layer 120, 420 is identical to that of the magnetic free layer 140, 440.

The magnetic vortex core formed in the magnetic free layer 140, 440 rotates by applying the RCP current or RCP magnetic field to the magnetic free layer 140, 440. A TMR is measured by applying a DC voltage between the magnetic pinned layer 120, 420 and the magnetic free layer 140, 440 while rotating the magnetic vortex core formed in the magnetic free layer 140, 440. If the measured TMR is smaller than a preset reference value, information stored in the magnetic recording element is read as "1". Otherwise, information stored in the magnetic recording element is read as "0".

In contrast, a TMR is measured by applying a DC voltage between the magnetic pinned layer 120, 420 and the magnetic free layer 140, 440 while rotating the magnetic vortex core formed in the magnetic free layer 140, 440 by applying the LCP current or LCP magnetic field to the magnetic free layer 140, 440. If the measured TMR is greater than a preset reference value, information stored in the magnetic recording element is read as "1". Otherwise, information stored in the magnetic recording element is read as "0".

Following description will be made on another example of reading information by measuring TMR when the magnetic vortex is formed in the magnetic pinned layer 2520. To begin with, the case where the core orientation of the magnetic vortex formed in the magnetic free layer 140, 440 is the upward direction is assigned "1", and the case where the core orientation of the magnetic vortex formed in the magnetic free layer 140, 440 is the downward direction is assigned "0". The magnetic pinned layer 120, 420 is formed such that the core orientation of the magnetic vortex formed in the magnetic pinned layer 120, 420 is identical in the core orientation of the magnetic vortex formed in the magnetic free layer 140, 440. Furthermore, the magnetic pinned layer 120, 420 is formed such that the parallel magnetization direction of the magnetic pinned layer 120, 420 is identical to that of the magnetic free layer 140, 440.

A TMR is measured by applying a DC voltage between the magnetic pinned layer 120, 420 and the magnetic free layer 140, 440 while rotating the magnetic vortex core formed in the magnetic free layer 140, 440 by applying the RCP current or RCP magnetic field to the magnetic free layer 140, 440. Likewise, a TMR is measured by applying a DC voltage between the magnetic pinned layer 120, 420 and the magnetic free layer 140, 440 while rotating the magnetic vortex core formed in the magnetic free layer 140, 440 by applying the LCP current or LCP magnetic field to the magnetic free layer 140, 440.

If the TMR measured by applying the RCP current or RCP magnetic field is smaller than the TMR measured by applying the LCP current or LCP magnetic field, information stored in the magnetic recording element is read as "1". Otherwise, information stored in the magnetic recording element is read as "0".

Although the aforesaid embodiment describes that the circularly polarized current or the circularly polarized magnetic field is applied to the magnetic free layer 140, 440, the present invention is not limited thereto. For example, the case of applying the elliptically polarized current or the elliptically polarized magnetic field is also similar to the above. Also, similar is the case of applying a pulse. However, if applying the pulse, power consumption may be reduced when the magnetic vortex formed in the magnetic free layer 140, 440 rotates at a frequency differing from an eigenfrequency thereof. This can be optimized through simulation. Even when the pulse is applied, the case where the amplitude or direction trace of a current or magnetic field applied to the magnetic free layer 140, 440 over time has a circular form makes it easy to read information because the movement of the magnetic vortex core approaches a circular motion.

As one example, in the case where sine or cosine pulses are applied using two drive electrode pairs or two drive electrodes, the successive pulse can be applied at an interval of a quarter of period.

As another example, a pulse having a Gaussian distribution may be applied using two drive electrode pairs or two drive electrodes. The power consumption is minimized when a full-width at half maximum (FWHM) is about 0.3748 times the resonance period ($\tau_0 = 1/\nu_0$) which is a reciprocal of the eigenfrequency of the magnetic vortex formed in the magnetic free layer 140. That is, the pulse having the Gaussian distribution and having the FWHM that is about 0.3748 times the resonance period of the magnetic vortex formed in the magnetic free layer 140 can be applied at an interval of about 0.6771 times the FWHM. The pulse-type voltage having the Gaussian distribution may be applied once or several times. To minimize power consumption, an interval between respective pulses is made to equal the resonance period of the magnetic vortex formed in the magnetic free layer 140.

While the present embodiment shows and describes that the magnetic vortex is formed in the magnetic pinned layer, the case where a magnetic single domain having a magnetization state arranged in parallel with the top surface of the magnetic pinned layer 2520 is formed in the magnetic pinned layer 2520 is also similar to the above, as illustrated in FIG. 27. To form the magnetic single domain in the magnetic pinned layer 2520, the magnetic pinned layer 2520 is formed so as to have the thickness and diameter corresponding to the region I of FIG. 2.

Unlike the case (see FIG. 24) where the magnetic vortex is formed in the magnetic pinned layer, there is no average relative difference in parallel magnetization although the magnetic vortex core formed in the magnetic free layer 2540 rotates in the case (see FIG. 27) where the magnetic single domain is formed in the magnetic pinned layer. However, in the case (see FIG. 27) where the magnetic single domain is formed in the magnetic pinned layer, a relative difference in parallel magnetization direction varies with time according as the magnetic vortex core formed in the magnetic free layer 2540 rotates.

As illustrated in FIG. 27, when the magnetic vortex core formed in the magnetic free layer 2540 rotates by applying a circularly polarized current or a circularly polarized magnetic field to the magnetic recording element where magnetization is formed in a direction illustrated in FIG. 27, the magnetic vortex core moves with the time, as illustrated in FIGS. 28 and 29. When the magnetic vortex core shifts to the right as illustrated in FIG. 28, a lot of left portions 2610 of the magnetic free layer 2540 have magnetization directions identical or similar to the parallel magnetization direction of the magnetic pinned layer 2520. However, as illustrated in FIG. 29, when the magnetic vortex core shifts to the left, a lot of right portions 2620 of the magnetic free layer 2540 have magnetization directions opposite to the parallel magnetization direction of the magnetic pinned layer 2520

In this way, the relative difference in parallel magnetization direction varies with time when the magnetic single domain is formed in the magnetic pinned layer 2520 in parallel with the top surface of the magnetic pinned layer 2520. The variation amount of the parallel magnetization direction depends on a difference in rotation radius of the magnetic vortex core formed in the magnetic free layer 2540. In other words, when the rotation radius of the magnetic vortex increases, the variation amount increases; however, when the rotation radius of the magnetic vortex decreases, the variation amount decreases. Since the relative difference in parallel magnetization direction is represented by the magnetoresistance difference, the variation rate of magnetoresistance also depends on the rotation radius of the magnetic vortex core.

FIG. 30 is a graph showing magnetoresistance versus time. The magnetoresistance is represented as a TMR ratio. At this time, an insulating layer 2530 is used to increase the TMR effect, and magnesium oxide showing good TMR effect is used for the insulating layer 2530. In FIG. 30, the curve indicated by reference numeral 2710 corresponds to the case where the core orientation of the magnetic vortex formed in the magnetic free layer 2540 is an upward direction, and the curve indicated by reference numeral 2720 corresponds to the case where the core orientation of the magnetic vortex formed in the magnetic free layer 2540 is an downward direction. An LCP current or an LCP magnetic field is applied to the magnetic free layer 2540. As described above, if the LCP current or the LCP magnetic field is applied, the variation rate of a TMR ratio over time becomes large because the rotation radius is great (see the curve 2710) when the core orientation of the magnetic vortex formed in the magnetic free layer 2540 is an upward direction. On the contrary, when the core orientation of the magnetic vortex formed in the magnetic free layer 2540 is a downward direction, the rotation radius is small and thus the variation rate of a TMR ratio over time becomes small (see the curve 2720).

Therefore, from the measurement of the TMR obtained by applying a DC voltage between the magnetic free layer 2540 and the magnetic pinned layer 2520, it can be appreciated that the measured TMR also varies with time and such a difference in TMR ratio variation rate makes it possible to detect the core orientation of the magnetic vortex formed in the magnetic free layer 2540.

Meanwhile, when the magnetic pinned layer 2520 with a magnetic single domain formed is used, the magnetic single domain having a magnetization state arranged in parallel with the top surface of the magnetic pinned layer 2520 changes its direction only if a very high current or magnetic field is applied. Therefore, the magnetic single domain is little affected by a current or magnetic field that is used for rotating the magnetic vortex core formed in the magnetic free layer 2540. In addition, an exchange bias is used to further suppress this effect. That is, an antiferromagnetic layer is formed under the magnetic pinned layer 2520 to thereby prevent a structure of the magnetic single domain from being changed due to an external current or magnetic field.

Following description will be made on an example of reading information by measuring a TMR when the magnetic single domain having a magnetization state arranged in parallel with the top surface of the magnetic pinned layer 2520 is formed in the magnetic pinned layer 2520. To begin with, the case where the core orientation of the magnetic vortex formed in the magnetic free layer 2540 is the upward direction is assigned "1", and the case where the core orientation of the magnetic vortex formed in the magnetic free layer 2540 is the downward direction is assigned "0".

A TMR is measured by applying a DC voltage between the magnetic pinned layer 2520 and the magnetic free layer 2540 while rotating the magnetic vortex core formed in the magnetic free layer 2540 by applying the RCP current or RCP magnetic field. If a variation rate of the measured TMR is smaller than a preset reference value, information stored in the magnetic recording element is read as "1". Otherwise, information stored in the magnetic recording element is read as "0".

In contrast, a TMR is measured by applying a DC voltage between the magnetic pinned layer 2520 and the magnetic free layer 2540 while rotating the magnetic vortex core formed in the magnetic free layer 2540 by applying the LCP current or LCP magnetic field. If a variation rate of the measured TMR is greater than a preset reference value, information stored in the magnetic recording element is read as "1". Otherwise, information stored in the magnetic recording element is read as "0".

Following description will be made on another example of reading information by measuring a TMR when a magnetic single domain having a magnetization state arranged in parallel with the top surface of the magnetic pinned layer 2520 is formed in the magnetic pinned layer 2520. To begin with, the case where the core orientation of the magnetic vortex formed in the magnetic free layer 2540 is the upward direction is assigned "1", and the case where the core orientation of the magnetic vortex formed in the magnetic free layer 2540 is the downward direction is assigned "0".

A TMR is measured by applying a DC voltage between the magnetic pinned layer 2520 and the magnetic free layer 2540 while rotating the magnetic vortex core formed in the magnetic free layer 2540 by applying the RCP current or RCP magnetic field to the magnetic free layer 2540. Likewise, a TMR is measured by applying a DC voltage between the magnetic pinned layer 2520 and the magnetic free layer 2540 while rotating the magnetic vortex core formed in the magnetic free layer 2540 by applying the LCP current or LCP magnetic field to the magnetic free layer 2540.

If a variation rate of the TMR measured by applying the RCP current or RCP magnetic field is smaller than a variation rate of the TMR measured by applying the LCP current or LCP magnetic field, information stored in the magnetic recording element is read as "1". Otherwise, information stored in the magnetic recording element is read as "0".

Although the above embodiment describes that the circularly polarized current or the circularly polarized magnetic field is applied to the magnetic free layer 140, 440, the present invention is not limited thereto. For example, the application of the elliptically polarized current or the elliptically polarized magnetic field is also similar to the above. Also, similar is the case of applying a pulse.

As above, the aforesaid embodiment shows and describes a method for read-out of information in a magnetic recording element that measures the TMR effect by forming the insulating layer 130, 430 between the magnetic free layer 140, 440 and the magnetic pinned layer 120, 420 to maximize the magnetoresistance resulting from a relative difference in magnetization state between the magnetic free layer 140, 440 and the magnetic pinned layer 120, 420. Alternatively, to maximize the magnetoresistance, information of the magnetic recording element can also be read by forming a conductive layer between the magnetic free layer 140, 440 and the magnetic pinned layer 120, 420 and measuring GMR effect. The method for read-out of information in a magnetic recording element by forming the conductive layer and measuring the GMR effect is identical to the method for read-out of information by forming the insulating layer and measuring the TMR effect, excepting that the conductive layer is used instead of the insulating layer, and the GMR effect is measured instead of the TMR effect.

FIG. 31 is a flowchart illustrating a method for read-out of information in a magnetic recording element according to another embodiment of the present invention. For reference, description will be made that the method for read-out of information in the magnetic recording element is embodied using the magnetic recording elements 500 illustrated in FIG. 6. However, other magnetic recording elements may be available if they include a magnetic free layer with the magnetic vortex formed and a read line capable of measuring an induced voltage generated by the movement of the magnetic vortex.

Referring to FIG. 31, in operation S2810, the magnetic recording element 500 including the magnetic free layer 540 where the magnetic vortex is formed is prepared first. In operation S2820, "0" or "1" is assigned depending on the core orientation of the magnetic vortex formed in the magnetic free layer 540. Thereafter, in operation S2830, a current or magnetic field of which a direction varies with time is applied to the magnetic free layer 540 to allow the magnetic vortex core formed in the magnetic free layer 540 to rotate on the magnetic free layer 540. Operations S2810 to S2830 are identical to the operations S2010 to S2030 of FIG. 6.

Afterwards, in operation S2840, "0" or "1" is read by measuring a current generated by an induced voltage due to the rotation of the magnetic vortex core formed in the magnetic free layer 540.

When a current or magnetic field, desirably, a circularly polarized current or magnetic field, of which a direction varies with time, is applied to the magnetic free layer 540, the magnetic vortex core formed in the magnetic free layer 540 moves, as described above. A strong magnetic field is formed in the magnetic vortex core formed in the magnetic free layer 540. Therefore, as the magnetic vortex core moves, the magnetic field formed in the magnetic vortex core varies correspondingly. This variation in magnetic field causes an induced voltage to be generated around the magnetic free layer 540. Consequently, the induced voltage allows a current to flow through the read line 510 disposed around the magnetic free layer 540.

As described above, when a circularly polarized current or a circularly polarized magnetic field is applied to the magnetic free layer 540 to read information, the rotation radius of the magnetic vortex core formed in the magnetic free layer 540 varies depending on information stored in the magnetic recording element 500. The variation in the rotation radius of the magnetic vortex core also changes the variation in magnetic field formed in the magnetic vortex core. Accordingly, the induced voltage generated by the variation in magnetic field also varies so that a variation rate of current flowing through the read line 510 due to the induced voltage is changed depending on information stored in the magnetic recording element 500. In conclusion, when the variation rate of current is measured, it is possible to read information stored in the magnetic recording element 500.

Following description will be made on one example of reading information by measuring a variation rate of current flowing through the read line 510. To begin with, the case where the core orientation of the magnetic vortex formed in the magnetic free layer 540 is the upward direction is assigned "1", and the case where the core orientation of the magnetic vortex formed in the magnetic free layer 540 is the downward direction is assigned "0".

A current flowing through the read line 510 is measured while rotating the magnetic vortex core formed in the magnetic free layer 540 by applying an RCP current or an RCP magnetic field to the magnetic free layer 540. If the measured variation rate of current is smaller than a preset reference value, information stored in the magnetic recording element is read as "1". Otherwise, information stored in the magnetic recording element is read as "0".

In contrast, a current flowing through the read line 510 is measured while rotating the magnetic vortex core formed in the magnetic free layer 540 by applying an LCP current or an LCP magnetic field to the magnetic free layer 540. If the measured variation rate of current is greater than a preset reference value, information stored in the magnetic recording element is read as "1". Otherwise, information stored in the magnetic recording element is read as "0".

Following description will be made on another example of reading information by measuring a variation rate of current flowing through the read line 510. To begin with, the case where the core orientation of the magnetic vortex formed in the magnetic free layer 540 is the upward direction is assigned "1", and the case where the core orientation of the magnetic vortex formed in the magnetic free layer 540 is the downward direction is assigned "0".

A variation rate of a current flowing through the read line 510 is measured while rotating the magnetic vortex core formed in the magnetic free layer 540 by applying an RCP current or an RCP magnetic field to the magnetic free layer 540. Likewise, a variation rate of a current flowing through the read line 510 is measured while rotating the magnetic vortex core formed in the magnetic free layer 540 by applying an LCP current or an LCP magnetic field to the magnetic free layer 540.

If the variation rate of current measured by applying the RCP current or RCP magnetic field is smaller than the variation rate of current measured by applying the LCP current or LCP magnetic field, information stored in the magnetic recording element is read as "1". Otherwise, information stored in the magnetic recording element is read as "0".

Although the above embodiment describes that the circularly polarized current or the circularly polarized magnetic field is applied to the magnetic free layer 540, the present invention is not limited thereto. For example, the application of the elliptically polarized current or the elliptically polarized magnetic field is also similar to the above. Also, similar is the case of applying a pulse.

FIG. 32 is a schematic perspective view of an MRAM 2900 used in a method for read-out of information according to an embodiment of the present invention.

Referring to FIG. 32, the MRAM 2900 according to the embodiment of the present invention includes an array of magnetic recording elements 100 of FIG. 1 arranged in rows and columns.

The respective magnetic recording elements 100 are connected to each other through drive electrodes 150a, 150b, 151a and 151b formed on a magnetic free layer 140, and a read electrode 110 formed under a magnetic pinned layer 120. The drive electrodes 150a, 150b, 151a and 151b are composed of four electrodes. Of the four drive electrodes 150a, 150b, 151a and 151b, two electrodes 150a and 150b facing each other form one electrode pair 150, and the other two electrodes 151a and 151b facing each other form another electrode pair 151. The read electrode 110 is composed of a single electrode, and extends in a direction between the drive electrode pairs 150 and 151. That is, the read electrode 110 is disposed at an angle of 45 degrees with respect to the two drive electrode pairs 150 and 151. At this time, the read electrodes 110 are arranged in the same direction.

The respective magnetic recording elements form the array in a configuration that the adjacent magnetic recording elements share the drive electrode and the read electrode. For example, the drive electrode indicated by reference numeral 150b of the drive electrodes 150a, 150b, 151a and 151b included in the magnetic recording element indicated by reference numeral 100 is connected to the magnetic recording element indicated by reference numeral 101. Therefore, the magnetic recording elements indicated by reference numeral 100 and 101 share the drive electrode indicated by reference numeral 150b. Likewise, the magnetic recording elements indicated by reference numerals 100 and 102 share the drive electrode indicated by reference numeral 151b. The read electrode 110 included in the magnetic recording element indicated by reference numeral 100 is connected to the magnetic recording element indicated by reference numeral 103 that is the second closest magnetic recording element. That is, the magnetic recording elements indicated by reference numerals 100 and 103 share the read electrode indicated by reference numeral 110.

FIG. 33 is a schematic perspective view of an MRAM 3200 used in a method for read-out of information according to another embodiment of the present invention.

The magnetic recording element forming the MRAM 3200 of FIG. 33 is the magnetic recording element 400 of FIG. 5. That is, in the MRAM 3200 of FIG. 33, the magnetic recording elements 400 of FIG. 5 are arranged in rows and columns, and the respective magnetic recording elements 400 form an array so as to share the drive electrodes 450 and 451 and the read electrode 410 with the magnetic recording elements 400 adjacent thereto. The MRAM 3200 of FIG. 33 only differs in the drive electrode structure from the MRAM 2900 of FIG. 32, and other parts correspond to those of the MRAM 2900 of FIG. 32. The drive electrodes 450 and 451 of the MRAM 3200 of FIG. 33 are disposed on the magnetic free layer 440 in a configuration to cross each other at a right angle. As illustrated in FIG. 32, the drive electrodes 450 and 451 connect the closet magnetic recording elements, and the read electrode 410 connects the second closest magnetic recording elements.

The MRAM including an array of the magnetic recording elements of FIG. 5 arranged in rows and columns has not only a configuration of FIG. 33, but also another configuration where the read electrode 410 connects the closest magnetic recording elements and the drive electrodes connect the second closest magnetic recording elements. Number of the drive electrodes may be three or more. Even though the number of the drive electrodes is two, both the two drive electrodes may be formed on the undersurface of the magnetic recording element 440 or formed on the top surface and the undersurface of the magnetic free layer, respectively, which differs the configuration of FIG. 33. The magnetic recording elements may cross each other at an angle other than 90 degrees.

Each of the magnetic recording elements 100, 400 of the MRAMs 2900 and 3200 in FIGS. 32 and 33 should exhibit the same characteristics regardless of its location. To be specific, each of the magnetic recording elements 100, 400 of the MRAMs 2900 and 3200 should exhibit the same response to a current or magnetic field applied to store, record and read information. Therefore, the magnetic recording elements 100, 400, 500 forming the MRAM 2900, 3200 should have the same shape and thickness, and be formed of the same material.

In particular, the MRAM 2900, 3200 is configured such that the magnetic vortices formed in the magnetic free layers 140 and 440 included in all the magnetic recording elements of the MRAM 2900, 3200 may have the same eigenfrequency. Furthermore, the MRAM 2900, 3200 is configured such that the direction of parallel magnetization formed in the magnetic free layer 140, 440 may be the same in all the magnetic recording elements.

The magnetic vortex core may be formed in the magnetic pinned layers 120, 420 included in the magnetic recording element 100, 400 of the MRAM 2900, 3200 illustrated in FIG. 32 or FIG. 33. The core orientation of the magnetic vortex formed in the magnetic pinned layer 120, 420 is the same in all the magnetic recording elements. The magnetic vortices formed in the magnetic pinned layer 120 and 420 also have the same eigenfrequency in all the magnetic recording elements. Also, the MRAM 2900, 3200 may be configured such that the rotation direction of the parallel magnetization arranged parallel with the top surface of the magnetic pinned layer 120, 420 and arranged around the magnetic vortex core of the magnetic pinned layer 120, 420 is also identical in all the magnetic recording elements. The rotation direction of the parallel magnetization may also be the same as the rotation direction of the parallel magnetization arranged in parallel with the top surface of the magnetic free layer 140, 440 around the magnetic vortex core formed in the magnetic free layer 140, 440. The reason is to minimize an error that may occur during reading of information, and to achieve distinct differences of characteristics measured during reading of information.

However, as described above, the magnetic vortex core formed in the magnetic pinned layer 120, 420 should not move easily although a current or magnetic field is applied to move the magnetic vortex core formed in the magnetic free layer 140, 440. Therefore, the eigenfrequency of the magnetic vortex core formed in the magnetic free layer 140, 440 should differ from that of the magnetic vortex core formed in the magnetic pinned layer 120, 420.

In addition, a magnetic single domain having a magnetization state arranged in parallel with the top surface of the magnetic pinned layer 120, 420 may be formed in the magnetic pinned layer 120, 420 included in the magnetic recording element 100, 400 of the MRAM 2900, 3200 illustrated in FIGS. 32 and 33. The magnetic single domain should have the same magnetization direction in all magnetic recording elements. The reason is also to minimize an error that may occur during reading of information, and to achieve distinct differences of characteristics measured during reading of information.

FIG. 34 is a schematic perspective view of an MRAM 3300 used in a method for read-out of information according to still another embodiment of the present invention.

The magnetic recording element included in the MRAM 3300 of FIG. 34 is the magnetic recording element 500 shown in FIG. 6. That is, the MRAM 3300 of FIG. 34 has such a configuration that the magnetic recording elements 500 of FIG. 6 are arranged in rows and columns, and the respective magnetic recording elements 500 form an array so as to share the drive electrodes 550a, 550b, 551a and 551b and the read line 510 with the magnetic recording elements 500 adjacent thereto. The MRAM 3300 of FIG. 34 is similar to the MRAM 2900 of FIG. 32. However, the MRAM 3300 of FIG. 34 is configured with the magnetic recording elements 500 and each of the magnetic recording elements 500 includes the read line 510 that is disposed around the magnetic free layer 540 and electrically insulated, instead of the read line 110 included in the magnetic recording element 100 of FIG. 32. In addition, the MRAM 3300 of FIG. 34 does not need the magnetic pinned layer 110 and the insulating layer 130 included in the magnetic recording element 100 of FIG. 32.

The read line 510 is provided for reading information. That is, as described above, an induced voltage is generated by the rotation of the magnetic vortex core formed in the magnetic free layer 540, and information is thus read through a current flowing through the read line 510 due to the induced voltage. The induced voltage generated by the rotation of the magnetic vortex core formed in the magnetic free layer 540 is not generated at both terminals of the read line 510 but generated spatially. Therefore, an undesired current may flow through the read line 510 due to the induced voltage generated in a magnetic recording element which is not a magnetic recording element to be read out during the application of the current or magnetic field. Consequently, the read line 510 may be formed spatially far in a direction between the drive electrodes 550a, 550b, 551a and 551b so as to reduce an error that may occur during the read operation.

Like the MRAMs 2900 and 3200 illustrated in FIGS. 32 and 33, each of the magnetic recording elements 500 in the MRAM 3300 of FIG. 34 should exhibit the same characteristics regardless of its location. To be specific, the magnetic recording elements 500 should exhibit the same response to a current or magnetic field applied to store, record and read information. Therefore, the read line 510, the magnetic free layer 540 and the drive electrodes 550a, 550b, 551a and 551b should respectively have the same shape and thickness, and be formed of the same material in all the magnetic recording elements.

In particular, the magnetic vortices formed in the magnetic free layers 540 included in all the magnetic recording elements of the MRAM 3300 should have the same eigenfrequency. Furthermore, the MRAM 3300 should be configured such that the rotation directions of the parallel magnetization arranged in parallel with the top surface of the magnetic free layer 540 around the magnetic vortex core formed in the magnetic free layer 540 should be identical to each other in all the magnetic recording elements.

Although the magnetic recording element 500 of the MRAM 3300 in FIG. 34 has a configuration that the drive electrodes 550a, 550b, 551a and 551b are disposed to form an ohmic contact with the magnetic free layer 540, it may have another configuration that drive electrodes having the same structure as the drive electrodes 450 and 451 included in the magnetic recording element 400 of the MRAM 3200 of FIG. 33 are formed on or beneath the magnetic free layer 540. In this case, a current is applied through the drive electrodes 450 and 451 to apply a magnetic field to the magnetic free layer 540, and resultantly the magnetic vortex core formed in the magnetic free layer 540 is rotated.

FIG. 35 is a flowchart illustrating a method for read-out of information in an MRAM according to an embodiment of the present invention. For reference, it will be described that a method for read-out of information in an MRAM to be described later is realized using the MRAM 2900 of FIG. 32. However, other MRAMs, e.g., MRAM 3200 of FIG. 33, are also available if they include an array of magnetic recording elements arranged in rows and columns and each of the magnetic recording element includes a read electrode, a magnetic pinned layer, a magnetic free layer with a magnetic vortex formed, and a drive electrode capable of applying a current or magnetic field of which a direction varies with time.

Referring to FIG. 35, in operation S3710, an MRAM 2900 is prepared, in which magnetic recording elements 100 are arranged in rows and columns. Here, the magnetic recording element 100 includes a magnetic pinned layer 120, an insulating layer 130, and a magnetic free layer 140. To form the magnetic vortex in the magnetic free layer 140 included in the magnetic recording element 100, the magnetic free layer 140 is formed so as to have the diameter and thickness corresponding to the region II of FIG. 2.

In the MRAM 2900, as illustrated in FIG. 32, the magnetic recording elements 100 form an array in such a configuration that the adjacent magnetic recording elements 100 share the drive electrodes 150a, 150b, 151a and 151b and the read electrode 110. The drive electrodes 150a, 150b, 151a and 151b are formed at intervals of 90 degrees along a circumferential direction of the magnetic free layer 140. Of the four drive electrodes 150a, 150b, 151a and 151b, two electrodes 150a and 150b facing each other form one drive electrode pair, and the other two electrodes 151a and 151b facing each other form another drive electrode pair.

Next, in operation S3720, information is recorded in each of the magnetic recording elements 100. A method for recording information in the magnetic recording element 100 is to assign "0" or "1" according to the core orientation of the magnetic vortex formed in the magnetic free layer 140 included in the magnetic recording element. For example, information can be recorded in such a manner that the case where the core orientation of the magnetic vortex formed in the magnetic free layer 140 is an upward direction from the top surface of the magnetic free layer 140 is defined as "0", and the case where the core orientation of the magnetic vortex is a downward direction is defined as "1".

Thereafter, in operation S3730, the magnetic vortex core formed in the selected magnetic recording element rotates by applying a voltage to two drive electrode pairs included in the selected magnetic recording element that is selected to read out information, among the magnetic recording elements 100 of the MRAM 2900 of FIG. 32. As such, when AC voltages or pulse voltages are applied to the two drive electrode pairs, a current of which a direction varies with time is applied to the selected magnetic recording element. The method of applying the current whose direction varies with time through application of the AC voltages or pulse voltages to the two drive electrode pairs, has been already illustrated in FIGS. 9 through 17. That is, when a voltage is applied using the method illustrated in FIGS. 9 through 17, the current of which a direction varies with time is applied to the selected magnetic recording element.

In this way, the current whose direction varies with time is applied to the selected magnetic recording element, triggering the movement of the magnetic vortex core formed in the magnetic free layer 140 included in the selected magnetic recording element. Information stored in the selected magnetic recording element can be read by measuring the magnetoresistance resulting from a difference in parallel magnetization dynamically generated between the magnetic free layer 140 and the magnetic pinned layer 120 included in the selected magnetic recording element due to the magnetic vortex core motion.

In operation S3740, a magnetoresistance characteristic obtained by applying a voltage to the read electrode and one of the drive electrodes included in the selected magnetic recording element is measured to thereby read information recorded in the selected magnetic recording element. As described above, since there is a relative difference in parallel magnetization between the magnetic free layer and the magnetic pinned layer due to the difference in rotation radius when the magnetic vortex core formed in the magnetic free layer 140 rotates, information recorded in the selected magnetic recording element can be read out using the magnetoresistance deduced from the difference in parallel magnetization.

To this end, the magnetic vortex or the magnetic single domain having a magnetization state arranged in parallel with the top surface of the magnetic pinned layer may be formed in the magnetic pinned layer included in the selected magnetic recording element. As described already, an insulating layer is used in case of using the TMR effect, whereas a conductive layer is used in case of using the GMR effect.

FIG. 36 illustrates a method of applying a current to a selected magnetic recording element of the MRAM 2900 of FIG. 32 from which information is to be read out.

To apply a current whose direction varies with time to the selected magnetic recording element 3810, a voltage is applied to a first drive electrode pair composed of drive electrodes 3830 and 3831 and a second drive electrode pair composed of drive electrodes 3840 and 3841, which pass over the selected magnetic recording element 3810. The voltage may be applied to the drive electrode pairs such that a circularly polarized current is applied to the selected magnetic recording element 3810. At this time, the frequency of an applied current is set to equal the eigenfrequency of the magnetic vortex formed in the selected magnetic recording element 3810.

When a circularly polarized current is applied to the magnetic free layer of the selected magnetic recording element 3810, the magnetic vortex core formed in the magnetic free layer of the selected magnetic recording element 3810 rotates. At this time, a linearly polarized current is applied to a magnetic recording element (e.g., magnetic recording element 3810) of unselected magnetic recording elements, which shares drive electrodes 3830, 3831, 3840 and 3841 with the selected magnetic recording element 3810. Accordingly, the magnetic vortex core formed in the magnetic free layer of the unselected magnetic recording element, which is indicated by reference numeral 3820, also rotates.

That is, when a current or magnetic field is applied to the magnetic free layer to rotate the magnetic vortex core formed in the magnetic free layer of the selected magnetic recording element 3810, the magnetic vortex core formed in the magnetic free layer of the unselected magnetic recording element also rotates. Since the magnetic vortex core formed in the magnetic free layer of the unselected magnetic recording element 3820 also rotates, a magnetoresistance difference also occurs due to a relative difference in parallel magnetization between the magnetic free layer and the magnetic pinned layer included in the unselected magnetic recording element 3820. Consequently, the magnetoresistance difference generated from the unselected magnetic recording element 3820 should not be measured in order to read only information of the selected magnetic recording element 3810. To this end, the read electrode 3850 is formed in a direction between the first drive electrode pair 3830 and 3831 and the second drive electrode pair 3840 and 3841, and all the read electrodes should be arranged in the same direction.

FIG. 37 illustrates a process of measuring a magnetoresistance to read information stored in the selected magnetic recording element 3810 according to the present invention. As illustrated in FIG. 37, the magnetoresistance is deduced from the current measured by applying a voltage across the magnetic pinned layer 3920, the insulating layer 3930 and the magnetic free layer 3940 included in the selected magnetic recording element 3810. To apply the voltage across the magnetic pinned layer 3920, the insulating layer 3930 and the magnetic free layer 3940, a voltage is applied to the read electrode 3850 and one of the drive electrodes 3830, 3831, 3840 and 3841, e.g., drive electrode 3841, thereby measuring a current. The applied voltage may be a DC voltage. When the read electrode 3850 is disposed in this configuration, and the DC voltage is applied to the read electrode 3850 and the drive electrode 3841, the magnetoresistance difference of the unselected magnetic recording element 3820 is not shown, and therefore, only information of the selected magnetic recording element 3810 can be read.

As above, the method of reading information recorded in the MRAM 2900 of FIG. 32 is shown and described, but the present invention is not limited thereto. A method of reading information recorded in the MRAM 3200 of FIG. 33 is also similar to the above. In this case, however, there is a difference in that a current is applied to the drive electrodes 450 and 451 to read information recorded in the MRAM of FIG. 33. When an appropriate current is applied to the drive electrodes 450 and 451, a magnetic field of which a direction varies with time is applied to the magnetic free layer 440, which allows the magnetic vortex core formed in the magnetic free layer 440 to rotate. The method of reading information after the magnetic vortex core formed in the magnetic free layer 440 rotates is similar to the method of reading information of the MRAM of FIG. 32.

FIG. 38 is a flowchart illustrating a method for read-out of information in an MRAM according to another embodiment of the present invention. For reference, it will be described that a method for read-out of information in an MRAM to be described later is realized using the MRAM 3300 of FIG. 34.

However, other MRAMs are also available if they include magnetic recording elements arranged in rows and columns and each of the magnetic recording elements includes a magnetic free layer with a magnetic vortex formed and a read electrode capable of measuring an induced voltage generated by the movement of a magnetic vortex core.

Referring to FIG. 38, in operation S4010, an MRAM 3300 is prepared in which magnetic recording elements 500 are arranged in rows and columns. Here, the magnetic recording element 500 includes a read line 510, a magnetic free layer where the magnetic vortex is formed, and drive electrodes 550a, 550b, 551a and 551b that are disposed to form an ohmic contact with the magnetic free layer 540.

In operation S4020, information is recorded in each of the magnetic recording elements 540. Thereafter, in operation S4030, a voltage is applied to the drive electrodes 550a, 550b, 551a and 551b to rotate the magnetic vortex core formed in the magnetic free layer included in the selected magnetic recording element. Operations S4020 and S4030 are identical to operations S3720 and S3730 of FIG. 6, respectively.

Thereafter, in operation S4040, information recorded in the selected magnetic recording element is read by measuring a variation rate of a current flowing through the read line included in the selected magnetic recording element.

When a current or magnetic field whose direction varies with time, desirably, a circularly polarized current or a circularly polarized magnetic field is applied to the magnetic free layer 540, the magnetic vortex core formed in the magnetic free layer 540 moves as described above. A strong magnetic field is formed in the magnetic vortex core formed in the magnetic free layer 540. Accordingly, as the magnetic vortex core moves, the magnetic field formed in the magnetic vortex core also varies. Such a variation in magnetic field induces a voltage around the magnetic free layer 540. Consequently, a current flows through the read line 510 disposed around the magnetic free layer 540 due to the induced voltage.

As described above, when a circularly polarized current or a circularly polarized magnetic field is applied to the magnetic free layer 540 to read information, a rotation radius of the magnetic vortex core formed in the magnetic free layer 540 varies according to information stored in the magnetic recording element 500. The variation in rotation radius of the magnetic vortex core also changes the magnetic field formed in the magnetic vortex core. Accordingly, the induced voltage generated by the variation in magnetic field varies so that a variation rate of a current flowing through the read line by the induced voltage differs according to information stored in the magnetic recording element. Thus, the measurement of the variation rate of current makes it possible to read information stored in the selected magnetic recording element.

Meanwhile, when a current or magnetic field is applied to the magnetic free layer to rotate the magnetic vortex core formed in the magnetic free layer of the selected magnetic recording element, the magnetic vortex core formed in the magnetic free layer of the unselected magnetic recording element also rotates. Since the magnetic vortex core formed in the magnetic free layer of the unselected magnetic recording element also rotates, the induced voltage is also generated by the unselected magnetic recording element. Therefore, the induced voltage generated from the unselected magnetic recording element should not affect the read line provided in the selected magnetic recording element in order to read only information of the selected magnetic recording element. To this end, as illustrated in FIG. 34, the read line is formed in a direction between the drive electrodes, and all the read lines are arranged in the same direction. Such a configuration of the read line makes it possible to minimize an error that may occur during reading of information, and to achieve distinct differences of characteristics measured during reading of information.

As above, it is described that the drive electrodes are in ohmic contact with the magnetic free layer 540 included in the magnetic recording element 500, but the present invention is not limited thereto. For example, the drive electrodes may be formed on at least one of the top surface and undersurface of the magnetic free layer 540 in a configuration to cross each other, which provides similar results to the above. In this case, two drive electrodes may be formed on the magnetic free layer 540 in such a configuration to cross each other an angle of 90 degrees. However, when the drive electrodes may be formed on the magnetic free layer 540 and cross each other at an angle of 90 degrees, an AC voltage is not applied but an AC current is supplied to apply a magnetic field to the magnetic free layer 540. This differs from the case where the drive electrode is in ohmic contact with the magnetic free layer 540.

While the present invention has been particularly shown and described with reference to exemplary embodiments thereof, it will be understood by those of ordinary skill in the art that various changes in form and details may be made therein without departing from the spirit and scope of the present invention as defined by the following claims.

The invention claimed is:

1. A method for read-out of information in a magnetic recording element, the method comprising:
preparing a magnetic recording element including a magnetic free layer where a magnetic vortex is formed;
assigning "0" or "1" according to a core orientation of a magnetic vortex formed in the magnetic free layer;
rotating the magnetic vortex core formed in the magnetic free layer on the magnetic free layer by applying a current or magnetic field, of which a direction varies with time, to the magnetic free layer with the magnetic vortex formed; and
reading "0" or "1" assigned according to the core orientation of the magnetic vortex formed in the magnetic free layer by measuring a characteristic caused by a difference in a rotation radius of the magnetic vortex core, wherein the rotation radius of the magnetic vortex core that rotates by the applied current or magnetic field varies with the core orientation of the magnetic vortex formed in the magnetic free layer.

2. The method of claim 1, wherein the rotating of the magnetic vortex core formed in the magnetic free layer on the magnetic free layer comprises applying a current or magnetic field of which a direction varies with time to the magnetic free layer with the magnetic vortex formed, such that the magnetic vortex core formed in the magnetic free layer rotates at a speed lower than a critical speed allowing the core orientation of the magnetic vortex to be switched to the opposite direction.

3. The method of claim 1, wherein the rotating of the magnetic vortex core formed in the magnetic free layer on the magnetic free layer comprises applying any one of an elliptically polarized current, an elliptically polarized magnetic field, a circularly polarized current and a circularly polarized magnetic field to the magnetic free layer with the magnetic vortex formed,
wherein a frequency of the applied current or magnetic field is equal to an eigenfrequency of the magnetic vortex formed in the magnetic free layer.

4. The method of claim 1, wherein the magnetic recording element further comprises two drive electrode pairs disposed to form an ohmic contact with the magnetic free layer, and four drive electrodes included in the two drive electrode pairs are arranged at intervals of 90° along a circumferential direction of the magnetic free layer,
- wherein the two drive electrodes facing each other form one drive electrode pair, and the other two drive electrodes facing each other form another drive electrode pair, and
- the rotating of the magnetic vortex core formed in the magnetic free layer on the magnetic free layer comprises applying sine- or cosine-wave alternate current (AC) voltages having a phase difference and the same frequency to the two drive electrode pairs,
- wherein frequencies of the applied sine- or cosine-wave AC voltages are equal to an eigenfrequency of the magnetic vortex formed in the magnetic free layer.

5. The method of claim 1, wherein the magnetic recording element further comprises two drive electrode pairs disposed to form an ohmic contact with the magnetic free layer, and four drive electrodes included in the two drive electrode pairs are arranged at intervals of 90° along a circumferential direction of the magnetic free layer,
- wherein the two drive electrodes facing each other form one drive electrode pair, and the other two drive electrodes facing each other form another drive electrode pair, and
- the rotating of the magnetic vortex core formed in the magnetic free layer on the magnetic free layer comprises applying a pulse-type voltage having two Gaussian distributions to the two drive electrode pairs at different timings.

6. The method of claim 1, wherein the magnetic recording element further comprises two drive electrodes formed on at least one of a top surface and undersurface of the magnetic free layer in a configuration to cross each other at a right angle, and
- the rotating of the magnetic vortex core formed in the magnetic free layer on the magnetic free layer comprises applying sine- or cosine-wave AC currents having a phase difference and the same frequency to the two drive electrodes,
- wherein frequencies of the applied sine- or cosine-wave AC currents are equal to an eigenfrequency of the magnetic vortex formed in the magnetic free layer.

7. The method of claim 1, wherein the magnetic recording element further comprises two drive electrodes formed on at least one of a top surface and undersurface of the magnetic free layer in a configuration to cross each other at a right angle, and
- the rotating of the magnetic vortex core formed in the magnetic free layer on the magnetic free layer comprises applying a pulse-type current having two Gaussian distributions to the two drive electrodes at different timings.

8. The method of claim 1, wherein the magnetic recording element further comprises a magnetic pinned layer under the magnetic free layer,
- wherein a magnetic vortex is formed in the magnetic pinned layer,
- wherein an eigenfrequency of the magnetic vortex formed in the magnetic pinned layer differs from an eigenfrequency of the magnetic vortex formed in the magnetic free layer.

9. The method of claim 8, wherein:
- a parallel magnetization around a magnetic vortex core formed in the magnetic pinned layer is formed in the magnetic pinned layer such that it is parallel with a top surface of the magnetic pinned layer;
- a parallel magnetization around a magnetic vortex core formed in the magnetic free layer is formed in the magnetic free layer such that it is parallel with a top surface of the magnetic free layer; and
- the characteristic caused by the difference in the rotation radius of the magnetic vortex core formed in the magnetic free layer is a relative difference in parallel magnetization between the parallel magnetization formed in the magnetic free layer and the parallel magnetization formed in the magnetic pinned layer, according to the difference in the rotation radius of the magnetic vortex core formed in the magnetic free layer.

10. The method of claim 9, wherein the magnetic recording element further comprises an insulating layer between the magnetic free layer and the magnetic pinned layer, and
- the reading of "0" or "1" assigned according to the core orientation of the magnetic vortex formed in the magnetic free layer comprises reading "0" or "1" assigned according to the core orientation of the magnetic vortex formed in the magnetic free layer by measuring a tunneling magnetoresistance (TMR) deduced from a magnitude difference of current caused by the relative difference in parallel magnetization through applying a voltage between the magnetic pinned layer and the magnetic free layer.

11. The method of claim 10, wherein:
- the parallel magnetization formed in the magnetic pinned layer has a rotation direction identical to that of the parallel magnetization formed in the magnetic free layer;
- the assigning of "0" or "1" according to a core orientation of a magnetic vortex formed in the magnetic free layer comprises assigning "1" when a core orientation of the magnetic vortex formed in the magnetic free layer is an upward direction from the top surface of the magnetic free layer, and assigning "0" when a core orientation of the magnetic vortex formed in the magnetic free layer is a downward direction from the top surface of the magnetic free layer;
- the rotating of the magnetic vortex core formed in the magnetic free layer on the magnetic free layer comprises applying one of an elliptically polarized current, an elliptically polarized magnetic field, a circularly polarized current and a circularly polarized magnetic field to the magnetic free layer; and
- the reading of "0" or "1" assigned according to the core orientation of the magnetic vortex formed in the magnetic free layer comprises reading "1" if the TMR obtained by applying a right-polarized current or magnetic field is smaller than the TMR obtained by applying a left-polarized current or magnetic field, and reading "0" otherwise.

12. The method of claim 1, wherein the magnetic recording element further comprises a magnetic pinned layer under the magnetic free layer,
- wherein a magnetic single domain having a magnetization state arranged in parallel with a top surface of the magnetic pinned layer is formed in the magnetic pinned layer.

13. The method of claim 12, wherein the characteristic caused by the difference in the rotation radius of the magnetic vortex core formed in the magnetic free layer is a relative difference in a variation rate of parallel magnetization between a parallel magnetization formed around the magnetic vortex core of the magnetic free layer a parallel magnetization arranged in parallel with a top surface of the magnetic pinned layer, according to the difference in the rotation radius of the magnetic vortex core formed in the magnetic free layer.

14. The method of claim 13, wherein the magnetic recording element further comprises an insulating layer between the magnetic free layer and the magnetic pinned layer, and the reading of "0" or "1" assigned according to the core orientation of the magnetic vortex formed in the magnetic free layer comprises reading "0" or "1" assigned according to the core orientation of the magnetic vortex formed in the magnetic free layer by measuring a variation rate of a TMR deduced from a variation rate of a current resulting from the relative difference in the variation rate of parallel magnetization through applying a voltage between the magnetic pinned layer and the magnetic free layer.

15. The method of claim 14, wherein:

the assigning of "0" or "1" according to a core orientation of a magnetic vortex formed in the magnetic free layer comprises assigning "1" when a core orientation of the magnetic vortex formed in the magnetic free layer is an upward direction from the top surface of the magnetic free layer, and assigning "0" when a core orientation of the magnetic vortex formed in the magnetic free layer is a downward direction from the top surface of the magnetic free layer;

the rotating of the magnetic vortex core formed in the magnetic free layer on the magnetic free layer comprises applying one of an elliptically polarized current, an elliptically polarized magnetic field, a circularly polarized current and a circularly polarized magnetic field to the magnetic free layer; and the reading of "0" or "1" assigned according to the core orientation of the magnetic vortex formed in the magnetic free layer comprises reading "1" if a variation rate of the TMR obtained by applying a right-polarized current or magnetic field is greater than a variation rate of the TMR obtained by applying a left-polarized current or magnetic field, and reading "0" otherwise.

16. The method of claim 1, wherein the magnetic recording element further comprises a read line which is disposed around the magnetic free layer and a current generated by an induced voltage flows through, the induced voltage being generated by the movement of the magnetic vortex core formed in the magnetic free layer.

17. The method of claim 16, wherein the characteristic caused by the difference in the rotation radius of the magnetic vortex core formed in the magnetic free layer is a relative difference in a variation rate of a current flowing through the read line resulting from the difference in the rotation radius of the magnetic vortex core formed in the magnetic free layer.

18. The method of claim 17, wherein:

the assigning of "0" or "1" according to a core orientation of a magnetic vortex formed in the magnetic free layer comprises assigning "1" when a core orientation of the magnetic vortex formed in the magnetic free layer is an upward direction from the top surface of the magnetic free layer, and assigning "0" when a core orientation of the magnetic vortex formed in the magnetic free layer is a downward direction from the top surface of the magnetic free layer;

the rotating of the magnetic vortex core formed in the magnetic free layer on the magnetic free layer comprises applying one of an elliptically polarized current, an elliptically polarized magnetic field, a circularly polarized current and a circularly polarized magnetic field to the magnetic free layer; and the reading of "0" or "1" assigned according to the core orientation of the magnetic vortex formed in the magnetic free layer comprises reading "1" if a variation rate of a current flowing through the read line by applying a right-polarized current or magnetic field is greater than a variation rate of a current flowing through the read line by applying a left-polarized current or magnetic field, and reading "0" otherwise.

* * * * *